United States Patent
Yaegashi et al.

(10) Patent No.: US 10,754,072 B2
(45) Date of Patent: Aug. 25, 2020

(54) POLARIZER HAVING NON-POLARIZATION PORTIONS, A LONG POLARIZING PLATE AND IMAGE DISPLAY DEVICE COMPRISING THE POLARIZER

(71) Applicant: NITTO DENKO CORPORATION, Ibaraki-shi, Osaka (JP)

(72) Inventors: Masahiro Yaegashi, Ibaraki (JP); Daisuke Ogomi, Ibaraki (JP); Yuki Nakano, Ibaraki (JP); Yuji Saiki, Ibaraki (JP); Kota Nakai, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 58 days.

(21) Appl. No.: 15/322,310

(22) PCT Filed: Jun. 26, 2015

(86) PCT No.: PCT/JP2015/068502
§ 371 (c)(1),
(2) Date: Dec. 27, 2016

(87) PCT Pub. No.: WO2015/199215
PCT Pub. Date: Dec. 30, 2015

(65) Prior Publication Data
US 2017/0131451 A1   May 11, 2017

(30) Foreign Application Priority Data

Jun. 27, 2014 (JP) ................................. 2014-132469
Jun. 25, 2015 (JP) ................................. 2015-127642

(51) Int. Cl.
*G02B 5/30* (2006.01)
*B32B 7/02* (2019.01)
(Continued)

(52) U.S. Cl.
CPC ........ *G02B 5/3033* (2013.01); *B29D 11/0073* (2013.01); *B32B 3/266* (2013.01);
(Continued)

(58) Field of Classification Search
CPC ............ G02B 1/08; G02B 5/3025–305; G02B 5/3033; G02B 5/3041; G02B 5/305;
(Continued)

(56) References Cited

U.S. PATENT DOCUMENTS 2,409,923 A   10/1946   Barnes
2,647,440 A   8/1953   Rehorn
(Continued)

FOREIGN PATENT DOCUMENTS

CN   101569205 A   10/2009
CN   101925846 A   12/2010
(Continued)

OTHER PUBLICATIONS

Non Final Office Action dated May 31, 2018, issued in U.S. Appl. No. 15/306,316.
(Continued)

*Primary Examiner* — Arnel C Lavarias
(74) *Attorney, Agent, or Firm* — Westerman, Hattori, Daniels & Adrian, LLP

(57) ABSTRACT

A long polarizer that can achieve the multi-functionalization and high-functionalization of an electronic device, such as an image display apparatus, that shows no variation in quality when provided as a final product, and that is excellent in yield in its production. A polarizer including a long resin film containing a dichromatic substance, the polarizer having non-polarization portions arranged in a lengthwise direction and/or a widthwise direction at predetermined intervals, the non-polarization portions including decolored portions formed through partial decoloring.

17 Claims, 7 Drawing Sheets

(51) Int. Cl.

| | |
|---|---|
| *B32B 27/16* | (2006.01) |
| *B32B 23/20* | (2006.01) |
| *B32B 27/34* | (2006.01) |
| *B29D 11/00* | (2006.01) |
| *B32B 27/32* | (2006.01) |
| *B32B 3/30* | (2006.01) |
| *B32B 27/30* | (2006.01) |
| *B32B 27/20* | (2006.01) |
| *B32B 27/36* | (2006.01) |
| *B32B 7/06* | (2019.01) |
| *B32B 27/08* | (2006.01) |
| *B32B 23/08* | (2006.01) |
| *B32B 3/26* | (2006.01) |
| *G02B 1/14* | (2015.01) |
| *B32B 7/12* | (2006.01) |
| *H01L 51/52* | (2006.01) |
| *G02F 1/1335* | (2006.01) |
| *G02F 1/13363* | (2006.01) |

(52) U.S. Cl.
CPC .............. *B32B 3/30* (2013.01); *B32B 7/02* (2013.01); *B32B 7/06* (2013.01); *B32B 7/12* (2013.01); *B32B 23/08* (2013.01); *B32B 23/20* (2013.01); *B32B 27/08* (2013.01); *B32B 27/16* (2013.01); *B32B 27/20* (2013.01); *B32B 27/306* (2013.01); *B32B 27/308* (2013.01); *B32B 27/32* (2013.01); *B32B 27/325* (2013.01); *B32B 27/34* (2013.01); *B32B 27/36* (2013.01); *B32B 27/365* (2013.01); *G02B 1/14* (2015.01); *B29D 11/00644* (2013.01); *B32B 2255/10* (2013.01); *B32B 2255/26* (2013.01); *B32B 2307/42* (2013.01); *B32B 2307/536* (2013.01); *B32B 2307/732* (2013.01); *B32B 2307/748* (2013.01); *B32B 2405/00* (2013.01); *B32B 2457/20* (2013.01); *B32B 2457/202* (2013.01); *B32B 2457/206* (2013.01); *G02F 1/13363* (2013.01); *G02F 1/133528* (2013.01); *G02F 2001/133531* (2013.01); *G02F 2201/50* (2013.01); *G02F 2202/28* (2013.01); *H01L 51/5281* (2013.01); *H01L 51/5293* (2013.01)

(58) Field of Classification Search
CPC ......... G02F 1/133528; H04N 1/00129; H04N 7/142–144; H04N 2007/145; H04N 7/144; G03B 17/48; B29D 11/00644
USPC .... 359/486.01–486.03, 487.01–487.06, 894; 348/14.08–14.1, 14.09; 396/429; 428/1.31; 362/19; 353/20
See application file for complete search history.

(56) References Cited

U.S. PATENT DOCUMENTS

| | | | |
|---|---|---|---|
| 4,181,756 A | 1/1980 | Fergason | |
| 4,396,646 A | 8/1983 | Schuler et al. | |
| 4,466,704 A | 8/1984 | Schuler et al. | |
| 5,327,285 A | 7/1994 | Faris | |
| 5,374,477 A | 12/1994 | Lawless et al. | |
| 5,430,566 A | 7/1995 | Sakaya et al. | |
| 5,593,771 A | 1/1997 | Lawless et al. | |
| 5,926,310 A | 7/1999 | Tamura et al. | |
| 6,072,566 A | 6/2000 | Fujii et al. | |
| 6,188,451 B1 | 2/2001 | Fujii et al. | |
| 6,258,429 B1 | 7/2001 | Nelson | |
| 6,606,136 B2 | 8/2003 | Matsumoto et al. | |
| 6,757,102 B2 | 6/2004 | Nishida et al. | |
| 8,101,884 B2 | 1/2012 | Kato et al. | |
| 8,130,293 B2 | 3/2012 | Kanamori et al. | |
| 8,248,558 B2 | 8/2012 | Kimura et al. |
| 8,259,263 B2 | 9/2012 | Kimura et al. |
| 8,277,587 B2 | 10/2012 | Kimura et al. |
| 8,314,987 B2 | 11/2012 | Goto et al. |
| 8,320,042 B2 | 11/2012 | Goto et al. |
| 8,379,169 B2 | 2/2013 | Kitagawa et al. |
| 8,404,334 B2 | 3/2013 | Kimura et al. |
| 8,411,360 B2 | 4/2013 | Kitagawa et al. |
| 8,467,177 B2 | 6/2013 | Mathew et al. |
| 8,491,737 B2 | 7/2013 | Kimura et al. |
| 8,520,169 B2 | 8/2013 | Kitagawa et al. |
| 8,520,171 B2 | 8/2013 | Kitagawa et al. |
| 8,657,976 B2 | 2/2014 | Kimura et al. |
| 8,709,567 B2 | 4/2014 | Kitagawa et al. |
| 8,721,816 B2 | 5/2014 | Kitagawa et al. |
| 8,771,454 B2 | 7/2014 | Goto et al. |
| 8,852,374 B2 | 10/2014 | Goto et al. |
| 9,023,168 B2 | 5/2015 | Kitagawa et al. |
| 9,039,861 B2 | 5/2015 | Yasui et al. |
| 9,143,668 B2 | 9/2015 | Mathew et al. |
| 9,169,423 B2 | 10/2015 | Yasui et al. |
| 9,244,307 B2 | 1/2016 | Hada et al. |
| 9,283,740 B2 | 3/2016 | Kitagawa et al. |
| 9,291,744 B2 | 3/2016 | Sawada et al. |
| 9,329,307 B2 | 5/2016 | Sawada et al. |
| 9,372,505 B2 | 6/2016 | Mathew et al. |
| 9,381,534 B2 | 7/2016 | Kim et al. |
| 9,442,234 B2 | 9/2016 | Kitagawa et al. |
| 9,442,235 B2 | 9/2016 | Kitagawa et al. |
| 9,459,390 B2 | 10/2016 | Kitagawa et al. |
| 9,488,756 B2 | 11/2016 | Yasui et al. |
| 9,557,450 B2 | 1/2017 | Yasui et al. |
| 9,618,668 B2 | 4/2017 | Kitagawa et al. |
| 9,744,750 B2 | 8/2017 | Kitagawa et al. |
| 9,925,553 B2 | 3/2018 | Kim et al. |
| 10,009,525 B2 | 6/2018 | Mathew et al. |
| 10,228,496 B2 | 3/2019 | Yasui et al. |
| 10,359,553 B2 | 7/2019 | Lee et al. |
| 10,421,264 B2 | 9/2019 | Kitagawa et al. |
| 10,429,560 B2 | 10/2019 | Lee et al. |
| 10,436,960 B2 | 10/2019 | Lee et al. |
| 10,436,962 B2 | 10/2019 | Lee et al. |
| 2002/0071179 A1 | 6/2002 | Maeda et al. |
| 2004/0212555 A1 | 10/2004 | Falco |
| 2006/0222813 A1 | 10/2006 | Kato et al. |
| 2007/0224416 A1 | 9/2007 | Matsubayashi et al. |
| 2008/0192345 A1 | 8/2008 | Mochizuki et al. |
| 2009/0136712 A1 | 5/2009 | Sato |
| 2009/0278954 A1 | 11/2009 | Kanamori et al. |
| 2010/0032088 A1 | 2/2010 | Kato et al. |
| 2010/0283943 A1 | 11/2010 | Kimura et al. |
| 2010/0288420 A1 | 11/2010 | Kimura et al. |
| 2010/0316817 A1 | 12/2010 | Kimura et al. |
| 2012/0052197 A1 | 3/2012 | Sawada et al. |
| 2012/0055607 A1 | 3/2012 | Kitagawa et al. |
| 2012/0055608 A1 | 3/2012 | Kitagawa et al. |
| 2012/0055621 A1 | 3/2012 | Goto et al. |
| 2012/0055622 A1 | 3/2012 | Kitagawa et al. |
| 2012/0055623 A1 | 3/2012 | Kitagawa et al. |
| 2012/0056211 A1 | 3/2012 | Kitagawa et al. |
| 2012/0056340 A1 | 3/2012 | Kitagawa et al. |
| 2012/0057104 A1 | 3/2012 | Kitagawa et al. |
| 2012/0057107 A1 | 3/2012 | Kitagawa et al. |
| 2012/0057231 A1 | 3/2012 | Goto et al. |
| 2012/0057232 A1 | 3/2012 | Goto et al. |
| 2012/0058291 A1 | 3/2012 | Kitagawa et al. |
| 2012/0058321 A1 | 3/2012 | Goto et al. |
| 2012/0105400 A1 | 5/2012 | Mathew et al. |
| 2012/0106063 A1 | 5/2012 | Mathew et al. |
| 2012/0160420 A1 | 6/2012 | Kimura et al. |
| 2012/0180930 A1 | 7/2012 | Kimura et al. |
| 2012/0206641 A1 | 8/2012 | Baba |
| 2012/0211167 A1 | 8/2012 | Kimura et al. |
| 2012/0216937 A1 | 8/2012 | Kimura et al. |
| 2012/0300299 A1 | 11/2012 | Yasui et al. |
| 2013/0017363 A1 | 1/2013 | Morioka et al. |
| 2013/0100529 A1 | 4/2013 | Kitagawa et al. |
| 2013/0114139 A1 | 5/2013 | Kitagawa et al. |
| 2013/0141787 A1 | 6/2013 | Kim et al. |

(56) References Cited

U.S. PATENT DOCUMENTS

| | | |
|---|---|---|
| 2013/0160938 A1 | 6/2013 | Yasui et al. |
| 2013/0216805 A1 | 8/2013 | Yasui et al. |
| 2013/0265708 A1 | 10/2013 | Mathew et al. |
| 2014/0016198 A1 | 1/2014 | Sawada et al. |
| 2014/0044947 A1 | 2/2014 | Sawada et al. |
| 2014/0118826 A1 | 5/2014 | Jiao et al. |
| 2014/0130955 A1 | 5/2014 | Yasui et al. |
| 2014/0186568 A1 | 7/2014 | Kitagawa et al. |
| 2014/0342129 A1 | 11/2014 | Kim et al. |
| 2014/0378020 A1 | 12/2014 | Hada et al. |
| 2015/0158046 A1 | 6/2015 | Kim et al. |
| 2015/0160390 A1 | 6/2015 | Goyal et al. |
| 2015/0183199 A1 | 7/2015 | Kitagawa et al. |
| 2015/0219797 A1 | 8/2015 | Goto et al. |
| 2016/0025910 A1 | 1/2016 | Sawada et al. |
| 2016/0054494 A1 | 2/2016 | Kitagawa et al. |
| 2016/0103258 A1 | 4/2016 | Kitagawa et al. |
| 2016/0195644 A1 | 7/2016 | Yasui et al. |
| 2016/0195645 A1 | 7/2016 | Yasui et al. |
| 2016/0195653 A1 | 7/2016 | Lee et al. |
| 2016/0195767 A1 | 7/2016 | Lee et al. |
| 2016/0202403 A1 | 7/2016 | Mathew et al. |
| 2016/0212311 A1 | 7/2016 | Mathew et al. |
| 2016/0299271 A1 | 10/2016 | Lee et al. |
| 2016/0299272 A1 | 10/2016 | Lee et al. |
| 2016/0313480 A1 | 10/2016 | Lee et al. |
| 2016/0377777 A1 | 12/2016 | Lee et al. |
| 2017/0045656 A1 | 2/2017 | Ogomi |
| 2017/0045657 A1 | 2/2017 | Ogomi et al. |
| 2017/0052299 A1 | 2/2017 | Ogomi et al. |
| 2017/0090086 A1 | 3/2017 | Goto et al. |
| 2017/0090087 A1 | 3/2017 | Goto et al. |
| 2017/0129197 A1 | 5/2017 | Yaegashi et al. |
| 2017/0131448 A1 | 5/2017 | Lee et al. |
| 2017/0131449 A1 | 5/2017 | Yaegashi et al. |
| 2017/0131451 A1 | 5/2017 | Yaegashi et al. |
| 2017/0254939 A1 | 9/2017 | Lee et al. |
| 2018/0188421 A1 | 7/2018 | Yasui et al. |

FOREIGN PATENT DOCUMENTS

| | | |
|---|---|---|
| CN | 102331635 A | 1/2012 |
| CN | 102609038 A | 7/2012 |
| CN | 202394154 U | 8/2012 |
| CN | 105229506 A | 1/2016 |
| CN | 105247395 A | 1/2016 |
| JP | S48-38160 A | 6/1973 |
| JP | S48-64941 A | 9/1973 |
| JP | 58-49901 A | 3/1983 |
| JP | 58-168019 A | 10/1983 |
| JP | S58-168020 A | 10/1983 |
| JP | S58168018 A | 10/1983 |
| JP | S59-058419 A | 4/1984 |
| JP | 59-172610 A | 9/1984 |
| JP | 60-133401 A | 7/1985 |
| JP | H07-000770 B2 | 1/1995 |
| JP | H8506867 A | 7/1996 |
| JP | H09-241594 A | 9/1997 |
| JP | H10-90675 A | 4/1998 |
| JP | H10-183390 A | 7/1998 |
| JP | 11-52130 A | 2/1999 |
| JP | 2001-075048 A | 3/2001 |
| JP | 2003-207608 A | 7/2003 |
| JP | 2004-054031 A | 2/2004 |
| JP | 2005-089782 A | 4/2005 |
| JP | 2005-089783 A | 4/2005 |
| JP | 2005-326249 A | 11/2005 |
| JP | 2005-336249 A | 12/2005 |
| JP | 2006-308923 A | 11/2006 |
| JP | 2006-308938 A | 11/2006 |
| JP | 2007070440 A | 3/2007 |
| JP | 2007-241314 A | 9/2007 |
| JP | 2008-102246 A | 5/2008 |
| JP | 2008-102274 A | 5/2008 |
| JP | 2009-130317 A | 6/2009 |
| JP | 2011-081315 A | 4/2011 |
| JP | 2012-073563 A | 4/2012 |
| JP | 2012-073574 A | 4/2012 |
| JP | 2012-98726 A | 5/2012 |
| JP | 2012-133308 A | 7/2012 |
| JP | 2012-137738 A | 7/2012 |
| JP | 2013-65995 A | 4/2013 |
| JP | 2013-137738 A | 7/2013 |
| JP | 2013-218319 A | 10/2013 |
| JP | 2014-81482 A | 5/2014 |
| JP | 2014-081482 A | 5/2014 |
| JP | 2014081482 A2 † | 5/2014 |
| JP | 2014-167548 A | 9/2014 |
| JP | 2014-211548 A | 11/2014 |
| JP | 2015-215609 A | 12/2015 |
| JP | 2016-525725 A | 8/2016 |
| JP | 2016538599 A | 12/2016 |
| JP | 2017-500606 A | 1/2017 |
| JP | 2017-503193 A | 1/2017 |
| KR | 20050070688 A | 7/2005 |
| KR | 10-2005-0085865 A | 8/2005 |
| KR | 10-2009-0107648 A | 10/2009 |
| KR | 10-2009-0129947 A | 12/2009 |
| KR | 20090132406 A | 12/2009 |
| KR | 20100055388 A † | 5/2010 |
| KR | 10-2010-0087837 A | 8/2010 |
| KR | 10-2010-0125537 A | 12/2010 |
| KR | 10-2010-0125558 A | 12/2010 |
| KR | 20100125558 A † | 12/2010 |
| KR | 10-2011-0105803 A | 9/2011 |
| KR | 10-2011-0110889 A | 10/2011 |
| KR | 20110110889 A † | 10/2011 |
| KR | 2012-0046035 A | 5/2012 |
| KR | 10-2012-0118205 A | 10/2012 |
| KR | 10-2013-0012026 A | 1/2013 |
| KR | 2013-0019001 | 2/2013 |
| KR | 10-2013-0056323 A | 5/2013 |
| KR | 10-1293210 B1 | 8/2013 |
| KR | 10-2013-0098914 A | 9/2013 |
| KR | 10-2014-0009035 A | 1/2014 |
| KR | 10-2015-0058450 A | 5/2015 |
| KR | 10-2015-0086159 A | 7/2015 |
| KR | 10-2015-0111871 A | 10/2015 |
| KR | 10-2015-0111879 A | 10/2015 |
| KR | 10-2016-0089349 A | 7/2016 |
| KR | 10-1706863 B1 | 2/2017 |
| TW | 200420705 A | 10/2004 |
| TW | 200949321 A | 12/2009 |
| TW | 201028436 A | 8/2010 |
| TW | I333502 B | 11/2010 |
| TW | 201219914 A | 5/2012 |
| TW | 201224716 A1 | 6/2012 |
| TW | 201307512 A | 2/2013 |
| TW | 201329535 A | 7/2013 |
| TW | 201530199 A | 8/2015 |
| TW | 201602653 A | 1/2016 |
| WO | 2006/095815 A1 | 9/2006 |
| WO | 2008/155873 A1 | 12/2008 |
| WO | 2009/128122 A1 | 10/2009 |
| WO | 2014/065140 A1 | 5/2014 |
| WO | 2015/046969 A1 | 4/2015 |
| WO | 2015108261 A1 | 7/2015 |
| WO | 2015/147551 | 10/2015 |
| WO | 2015/147552 A1 | 10/2015 |
| WO | 2016/003105 A1 | 1/2016 |

OTHER PUBLICATIONS

Non Final Office Action dated May 17, 2018, issued in U.S. Appl. No. 15/321,875.

Office Action dated Dec. 6, 2017, issued in Korean Patent Application No. 10-2015-7036599 with translation (corresponding to U.S. Appl. No. 15/306,362).

International Search Report dated Aug. 11, 2015, issued in International Application No. PCT/JP2015/068504 (corresponds to U.S. Appl. No. 15/321,974).

(56) References Cited

OTHER PUBLICATIONS

Office Action dated Jan. 17, 2017 issued in Korean Patent Application No. 10-2015-7036688 with Englsih translation (corresponds to U.S. Appl. No. 15/321,974).
International Search Report dated Aug. 11, 2015, issued in International Application No. PCT/JP2015/068503 (corresponds to U.S. Appl. No. 15/321,875).
Korean Report on Prior Art Search issued in corresponding Korean Patent Application No. 10-2015-7036634 with English translation.
Office Action dated Mar. 9, 2017 issued in Japanese Patent Application No. 2015-127641 with English translation. (corresponds to U.S. Appl. No. 15/322,258).
Office Action dated Mar. 9, 2017, issued in corresponding Japanese Patent Application No. 2015-127642 with English translation.
Office Action dated Mar. 9, 2017, issued in Japanese Patent Application No. 2015-127644 with English translation. (corresponds to U.S. Appl. No. 15/321,974).
Non-Final Office Action dated Jun. 1, 2017, issued in U.S. Appl. No. 15/322,258.
International Search Report dated Aug. 11, 2015, issued in International Application No. PCT/JP2015/068501 (corresponds to U.S. Appl. No. 15/322,258).
Office Action dated May 25, 2016, issued in Korean Patent Application 10-2015-7036668 (counterpart of U.S. Appl. No. 15/322,258).
Final Office Action dated Nov. 2, 2017, issued in U.S. Appl. No. 15/322,258.
International Search Report dated Jul. 7, 2015, issued in PCT/JP2015/062357.
International Search Report dated Jun. 9, 2015, issued in PCT/JP2015/062358.
International Search Report dated Jul. 7, 2015, issued in PCT/JP2015/062359.
Office Action dated Mar. 8, 2017 issued in Japanese Patent Application No. JP2015087685.
Office Action dated Mar. 8, 2017 issued in Japanese Patent Application No. JP2015087686.
Office Action dated Mar. 8, 2017 issued in Japanese Patent Application No. JP2015087687.
Korean Prior Art Search issued in KR20157036565.
Office Action dated Jan. 16, 2017 issued in Korean Patent Application No. KR10-2015-7036599.
Office Action dated Jan. 16, 2017 issued in Korean Patent Application No. KR10-2015-7036600.
Office Action dated May 18, 2016 issued in Korean Patent Application No. KR10-2015-7036565.
Non-Final Office Action dated Nov. 15, 2017, issued in U.S. Appl. No. 15/321,974.
Non-Final Office Action dated Oct. 20, 2017, issued in U.S. Appl. No. 15/306,362.
Office Action dated Aug. 3, 2018, issued in Chinese application No. 201580022170.2 (Counterpart of U.S. Appl. Nos. 15/306,316, 15/306,390 and 15/306,362) with English translation. (22 pages).
Office Action dated Sep. 28, 2018, issued in Taiwanese application No. 104120928 (counterpart to U.S. Appl. No. 15/322,258), with English translation. (9 pages).
Office Action dated Oct. 19, 2018, issued in Taiwanese application No. 104113350 (counterpart to U.S. Appl. No. 15/306,362), with English translation. (9 pages).
Office Action dated Jul. 2, 2018, issued in Chinese application No. 201580035132.0, with English translation (corresponds to U.S. Appl. No. 15/321,875).
Office Action dated Jul. 2, 2018, issued in Chinese application No. 201580022128.0, with English translation (corresponds to U.S. Appl. No. 15/306,390.
Third Party Observation dated Jul. 31, 2018, filed in counterpart Japanese application No. 2015-127643 (counterpart to U.S. Appl. No. 15/321,875), with English translation. (33 pages).
Office Action dated Aug. 20, 2018, issued in Taiwanese application No. 104113355 (Counterpart of U.S. Appl. No. 15/306,316), with English translation. (23 pages).
Third Party Observation dated Sep. 3, 2018, issued in Japanese application No. 2015-190081(Counterpart of U.S. Appl. No. 15/271,949), with English translation. (24 pages).
Third Observation dated Aug. 28, 2018, issued in Japanese application No. 2015-190040, (Counterpart of U.S. Appl. No. 15/271,891), with English translation. (25 pages).
Office Action dated Aug. 23, 2018, issued in counterpart Taiwanese application No. 104120925, with English translation. (49 pages).
Non-Final Office Action dated Nov. 1, 2018, issued in U.S. Appl. No. 15/306,362 (20 pages).
Third Party Observation discovered Nov. 30, 2018, submitted to the Korean Patent Office on Aug. 23, 2018 for Korean application No. 10-2018-7003521, with English translation (counterpart to U.S. Appl. No. 15/306,390)(19 pages).
Office Action dated Dec. 18, 2018, issued in Taiwanese application No. 104120918, with English translation (counterpart to U.S. Appl. No. 15/321,875)(5 pages).
Non Final Office Action dated Apr. 5, 2018, issued in U.S. Appl. No. 15/306,390.
Explanation of Circumstances Concerning Accelerated Examination filed on Nov. 21, 2017 issued in Japanese patent application No. 2015-190040 with translation.
Explanation of Circumstances Concerning Accelerated Examination filed on Nov. 21, 2017 issued in Japanese patent application No. 2015-190081 with translation.
Explanation of Circumstances Concerning Accelerated Examination filed on Nov. 21, 2017 issued in Japanese patent application No. 2015-190128 with translation.
Office Action dated Jan. 24, 2018, issued in Japanese application No. JP2015-190040, with translation.
Office Action dated Jan. 24, 2018, issued in Japanese application No. JP2015-190081, with translation.
Office Action dated Jan. 24, 2018, issued in Japanese application No. JP2015-190128, with translation.
Japanese Office Action dated May 30, 2018, issued in Japanese Patent Application No. 2015-190081 with English translation (Corresponds to U.S. Appl. No. 15/271,949).
Non-Final Office Action dated Jul. 30, 2018, issued in U.S. Appl. No. 15/271,973.
Japanese Office Action dated May 30, 2018, issued in Japanese Patent Application No. 2015-190040 with English translation (Corresponds to U.S. Appl. No. 15/271,891).
Non Final Office Action dated Mar. 30, 2018, issued in U.S. Appl. No. 15/271,973.
Non Final Office Action dated Sep. 7, 2017, issued in U.S. Appl. No. 15/271,973.
Non Final Office Action dated Apr. 20, 2018, issued in U.S. Appl. No. 15/271,949.
Non Final Office Action dated Apr. 16, 2018, issued in U.S. Appl. No. 15/271,891.
Non Final Office Action dated Sep. 13, 2017, issued in U.S. Appl. No. 15/271,391.
Non-Final Office Action dated Feb. 27, 2019, issued in U.S. Appl. No. 15/271,949.
Advisory Action dated Feb. 4, 2019, issued in U.S. Appl. No. 15/306,390.
Final Office Action dated Oct. 18, 2018, issued in U.S. Appl. No. 15/306,390.
Office Action dated Apr. 8, 2019, issued in KR application No. 10-2016-0124048 (counterpart to U.S. Appl. No. 15/271,973), with English translation. (11 pages).
Office Action dated May 10, 2019, issued in TW application No. 104113359 (counterpart to U.S. Appl. No. 15/306,390), with English translation. (11 pages).
Non-Final Office Action dated Oct. 3, 2019, issued in U.S. Appl. No. 15/306,362.
International Search Report dated Sep. 20, 2016, issued in International Application No. PCT/JP2016/068134. (2 pages) (counterpart to U.S. Appl. No. 15/739,531).
Third Party Observation dated Jul. 23, 2018, issued in JP Application No. 2015-127717 (counterpart to U.S. Appl. No. 15/739,531), with English translation. (12 pages).

(56) References Cited

OTHER PUBLICATIONS

Third Party Observation dated Jul. 18, 2018, issued in KR application No. 10-2017-7036920 (counterpart to U.S. Appl. No. 15/739,531), with English translation. (22 pages).
Office Action dated Oct. 22, 2018, issued in KR Application No. 10-2017-7036920 (counterpart to U.S. Appl. No. 15/739,531), with English translation. (12 pages).
Office Action dated Aug. 2, 2019, issued in CN Application No. 201680037305.7 (counterpart to U.S. Appl. No. 15/739,531), with English translation. (17 pages).
Office Action dated Oct. 29, 2019, issued in TW Application No. 105119990 (counterpart to U.S. Appl. No. 15/739,531), with English translation. (17 pages).
Non-Final Office Action dated Sep. 20, 2019, issued in U.S. Appl. No. 15/739,531. (22 pages).
Third-Party Submission under 37 CFR 1.290, dated Sep. 16, 2019. (2 pages).
Office Action dated Mar. 20, 2020, issued in TW application No. 105128571 (counterpart to U.S. Appl. No. 15/271,973), with English translation. (14 pages).
Non-Final Office Action dated May 12, 2020, issued in U.S. Appl. No. 15/739,531. (10 pages).
Non-Final Office Action dated May 28, 2020, issued in U.S. Appl. No. 15/271,973. (20 pages).

† cited by third party

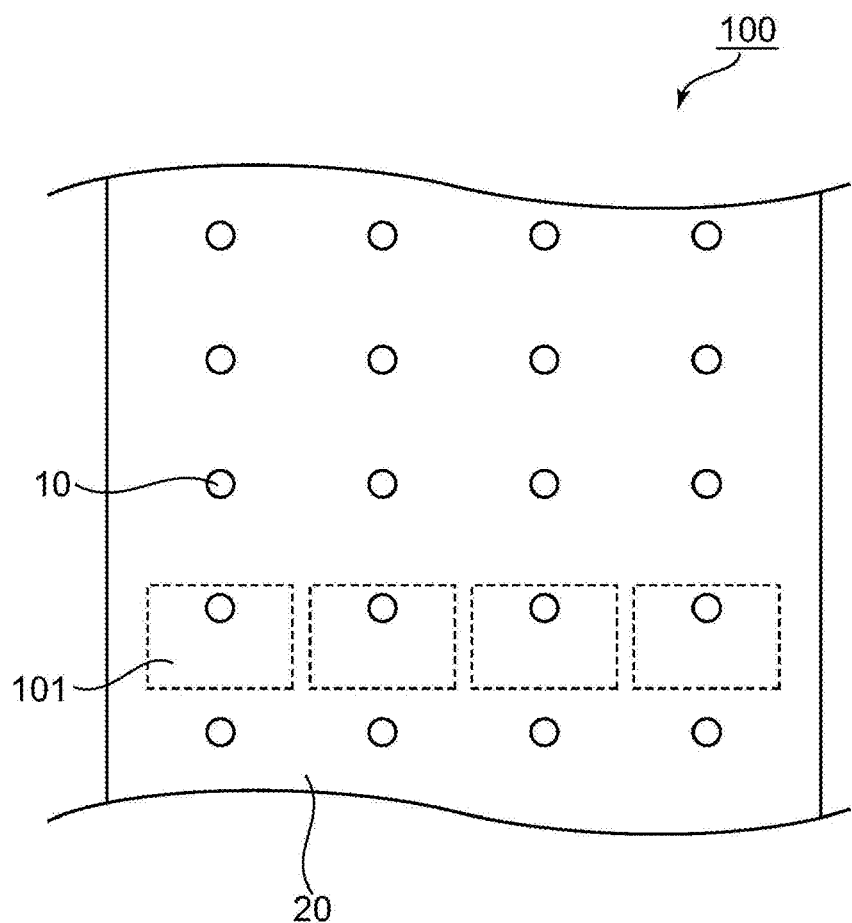

FIG. 5
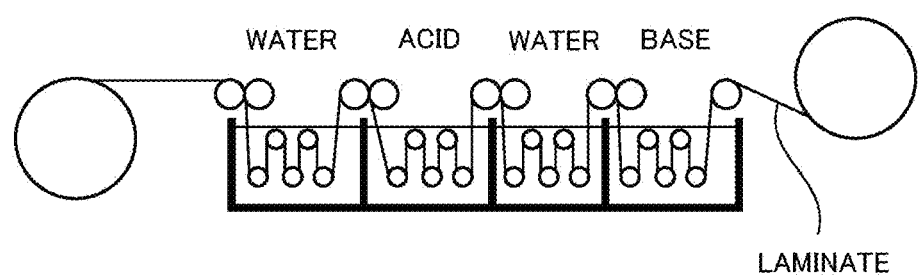
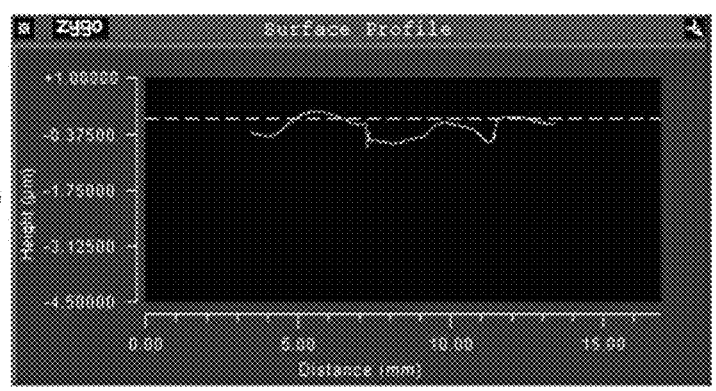
FIG. 6(a)
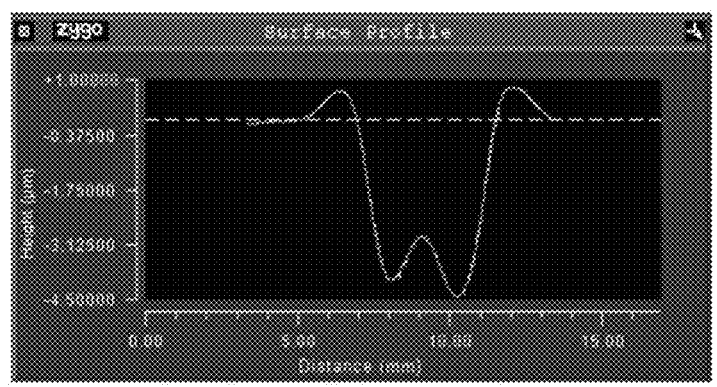
FIG. 6(b)

POLARIZER HAVING NON-POLARIZATION PORTIONS, A LONG POLARIZING PLATE AND IMAGE DISPLAY DEVICE COMPRISING THE POLARIZER

TECHNICAL FIELD

The present invention relates to a long polarizer, a long polarizing plate, and an image display apparatus. More specifically, the present invention relates to a long polarizer having non-polarization portions arranged according to a predetermined pattern, and a long polarizing plate and an image display apparatus each using the polarizer.

BACKGROUND ART

Some of the image display apparatus of a cellular phone, a notebook personal computer (PC), and the like have mounted thereon internal electronic parts, such as a camera. Various investigations have been made for the purpose of improving, for example, the camera performance of any such image display apparatus (for example, Patent Literatures 1 to 7). However, an additional improvement in camera performance or the like has been desired in association with rapid widespread use of a smart phone and a touch panel-type information processing apparatus. In addition, a polarizing plate partially having polarization performance has been required in order to correspond to the diversification of the shapes of the image display apparatus and the high-functionalization thereof. In order that those requirements may be satisfied industrially and commercially, it has been desired that the image display apparatus and/or a part thereof be produced at acceptable cost. However, there remain various matters to be investigated for establishing such technology.

CITATION LIST

Patent Literature

[PTL 1] JP 2011-81315 A
[PTL 2] JP 2007-241314 A
[PTL 3] US 2004/0212555 A1
[PTL 4] KR 10-2012-0118205 A
[PTL 5] KR 10-1293210 B1
[PTL 6] JP 2012-137738 A
[PTL 7] US 2014/0118826 A1

SUMMARY OF INVENTION

Technical Problem

The present invention has been made to solve the above-described problems, and a primary object of the present invention is to provide a long polarizer that can achieve the multi-functionalization and high-functionalization of an electronic device, such as an image display apparatus, that shows no variation in quality when provided as a final product, and that is excellent in yield in its production.

Solution to Problem

A polarizer according to an embodiment of the present invention includes a long resin film containing a dichromatic substance, the polarizer having non-polarization portions arranged in a lengthwise direction and/or a widthwise direction at predetermined intervals, the non-polarization portions including decolored portions formed through partial decoloring.

In one embodiment of the present invention, the non-polarization portions are arranged in the lengthwise direction at predetermined intervals.

In one embodiment of the present invention, the non-polarization portions are arranged in at least the lengthwise direction at substantially equal intervals.

In one embodiment of the present invention, the non-polarization portions are arranged in the lengthwise direction and the widthwise direction at substantially equal intervals.

In one embodiment of the present invention, when the polarizer is cut into a predetermined size to be mounted on an image display apparatus having a predetermined size, the non-polarization portions are each arranged at a position corresponding to a camera portion of the image display apparatus.

In one embodiment of the present invention, a direction of a straight line connecting the non-polarization portions adjacent to each other falls within a range of ±10° with respect to the lengthwise direction and/or the widthwise direction.

In one embodiment of the present invention, the non-polarization portions each have a transmittance of 90% or more.

In one embodiment of the present invention, the polarizer has a thickness of 10 μm or less.

In one embodiment of the present invention, the non-polarization portions are arranged in a dotted manner.

In one embodiment of the present invention, a plan-view shape of each of the non-polarization portions comprises a substantially circular shape or a substantially rectangular shape.

In one embodiment of the present invention, the non-polarization portions each include a recessed portion having a recessed surface on one surface side of the resin film.

In one embodiment of the present invention, the non-polarization portions include low concentration portions each having a content of the dichromatic substance lower than that of any other portion.

In one embodiment of the present invention, the content of the dichromatic substance in each of the low concentration portions is 0.2 wt % or less.

In one embodiment of the present invention, a content of an alkali metal and/or an alkaline earth metal in each of the low concentration portions is 3.6 wt % or less.

In one embodiment of the present invention, the low concentration portions are formed by bringing a basic solution into contact with the resin film.

In one embodiment of the present invention, the basic solution includes an aqueous solution containing a hydroxide of an alkali metal and/or an alkaline earth metal.

In one embodiment of the present invention, the polarizer has an absorption axis in a direction substantially parallel to the lengthwise direction or the widthwise direction, and both end portions of the polarizer are subjected to slitting parallel to the lengthwise direction.

In one embodiment of the present invention, the polarizer is wound in a roll shape.

In one embodiment of the present invention, the polarizer is cut into a predetermined size to be used for producing a plurality of polarizer pieces each having a non-polarization portion.

According to another aspect of the present invention, there is provided a long polarizing plate. The long polarizing plate includes: the polarizer as described above; and a protective film arranged on at least one side of the polarizer.

In one embodiment of the present invention, the protective film has a thickness of 80 μm or less.

In one embodiment of the present invention, the polarizing plate further includes a pressure-sensitive adhesive layer as one outermost layer.

In one embodiment of the present invention, the polarizing plate is cut into a predetermined size to be used for producing a plurality of polarizing plate pieces each including a polarizer having a non-polarization portion and a protective film arranged on at least one side of the polarizer.

According to another aspect of the present invention, there is provided an image display apparatus. The image display apparatus includes the above-described polarizer cut into a predetermined size, wherein the non-polarization portions of the polarizer are each arranged at a position corresponding to a camera portion.

Advantageous Effects of Invention

According to the present invention, the long polarizer having non-polarization portions arranged in a lengthwise direction and/or a widthwise direction at predetermined intervals (i.e., according to a predetermined pattern) is provided. In such polarizer, the positions of the non-polarization portions can be set in accordance with the size of a polarizer to be cut and mounted on an image display apparatus and the position of a camera portion of the image display apparatus. Accordingly, a yield at the time of the production of a polarizer having a predetermined size is extremely excellent. Further, the positions of the non-polarization portions can be accurately set, and hence the position of a non-polarization portion in the polarizer having a predetermined size to be obtained can also be satisfactorily controlled. Therefore, a variation in position of a non-polarization portion between the polarizers each having a predetermined size to be obtained becomes smaller, and hence final products (polarizers each having a predetermined size) free of variation in quality can be obtained. As a result, the polarizer of the present invention can contribute to the multi-functionalization and high-functionalization of an electronic device, such as an image display apparatus. Further, according to the polarizer of the present invention, a positional relationship between a non-polarization portion and an absorption axis can be controlled in the entirety of the long polarizer in a unified manner, and hence a final product excellent in axial accuracy (and hence excellent in optical characteristics) can be obtained.

BRIEF DESCRIPTION OF DRAWINGS

FIG. 2A is a schematic plan view for illustrating an example of the arrangement pattern of non-polarization portions in the polarizer according to the embodiment of the present invention.

FIG. 5 is a schematic view for illustrating the formation of non-polarization portions in the method of producing a polarizer according to the embodiment of the present invention.

FIG. 6(a) is a graph for showing the result of the evaluation of surface smoothness in Example 1, and FIG. 6(b) is a graph for showing the result of the evaluation of surface smoothness in Example 2.

DESCRIPTION OF EMBODIMENTS

Embodiments of the present invention are described below. However, the present invention is not limited to these embodiments.

A. Polarizer

Figure 1:
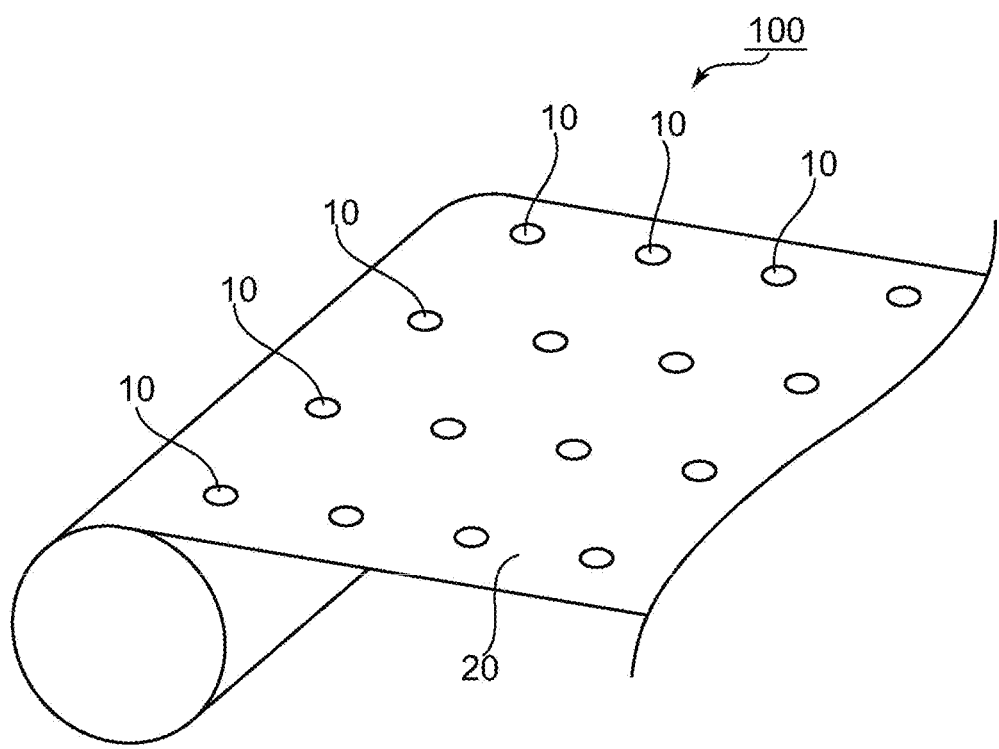
FIG. 1 is a schematic perspective view of a polarizer according to one embodiment of the present invention.

FIG. 1 is a schematic perspective view of a polarizer according to one embodiment of the present invention. A polarizer 100 is long and is typically wound in a roll shape as illustrated in FIG. 1. The term "long" as used herein means an elongated shape in which a length is sufficiently long as compared to a width, and includes, for example, an elongated shape in which a length is 10 or more times, preferably 20 or more times as long as a width. The polarizer 100 has non-polarization portions 10 arranged in a lengthwise direction and/or a widthwise direction at predetermined intervals (i.e., according to a predetermined pattern). The arrangement pattern of the non-polarization portions 10 may be appropriately set in accordance with purposes. When the polarizer 100 is cut (e.g., cut in the lengthwise direction and/or the widthwise direction, or punched) into a predetermined size to be mounted on an image display apparatus having a predetermined size, the non-polarization portions 10 are each typically arranged at a position corresponding to a camera portion of the image display apparatus. Therefore, when polarizers (polarizer pieces) having only one size are cut out of the one long polarizer 100, the non-polarization portions 10 may be arranged at substantially equal intervals in each of the lengthwise direction and the widthwise direction as illustrated in FIG. 1. According to such construction, the cutting of the polarizer into the predetermined size in accordance with the size of the image display apparatus is easily controlled, and hence a yield can be improved. Further, a variation in position of a non-polarization portion between the sheets of polarizer pieces cut out of the polarizer can be suppressed. The phrase "substantially equal intervals in each of the lengthwise direction and the widthwise direction" means that intervals in the lengthwise direction are equal to each other and intervals in the widthwise direction are equal to each other, and it is not necessary that the intervals in the lengthwise direction and the intervals in the widthwise direction be equal to each other. For example, when the intervals in the lengthwise direction are each represented by L1, and the intervals in the widthwise direction are each represented by L2, the L1 may be equal to the L2, or the L1 may not be equal to the L2. When polarizers having a plurality of sizes are cut out of the one long polarizer 100, the intervals between the non-polarization portions 10 in the lengthwise direction and/or the widthwise direction can be changed in accordance with the sizes of the polarizers to be cut out of the long polarizer. For example, the non-polarization portions 10 may be arranged at substantially equal intervals in the lengthwise direction and arranged at different intervals in the widthwise direction, or may be arranged at different intervals in the lengthwise direction and arranged at substantially equal intervals in the widthwise direction. When the non-polarization portions are arranged at different intervals in the lengthwise direction or the widthwise direction, all of intervals between adjacent non-polarization portions may be different, or only part of the intervals (intervals between specific adjacent non-polarization portions) may be different. In addition, the following may be performed: a plurality of regions are specified in the lengthwise direction of the polarizer 100, and the intervals between the non-polarization portions 10 in the lengthwise direction and/or the widthwise direction are set for each of the regions. As described above, one feature of the present invention lies in that: in the long polarizer, the non-polarization portions can be formed according to any appropriate arrangement pattern in accordance with purposes.

The polarizer pieces mean polarizers obtained by cutting the long polarizer. Herein, the polarizer pieces may be simply referred to as "polarizers" contextually.

Figure 2B:
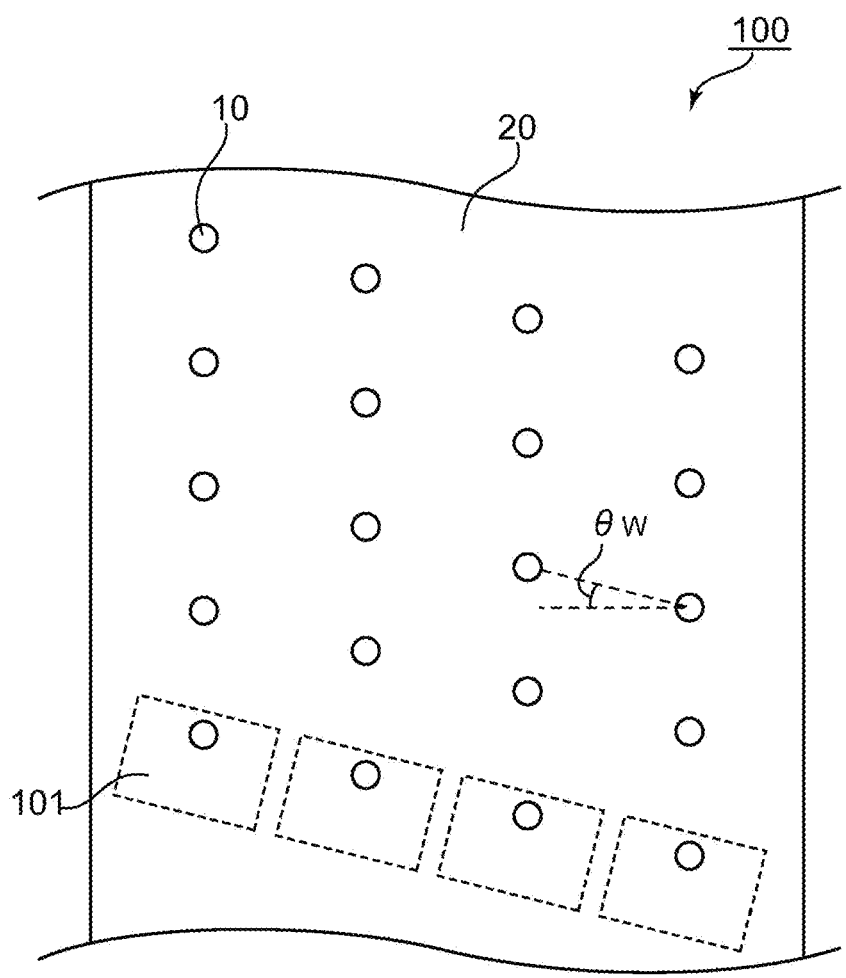
FIG. 2B is a schematic plan view for illustrating another example of the arrangement pattern of non-polarization portions in the polarizer according to the embodiment of the present invention.
Figure 2C:
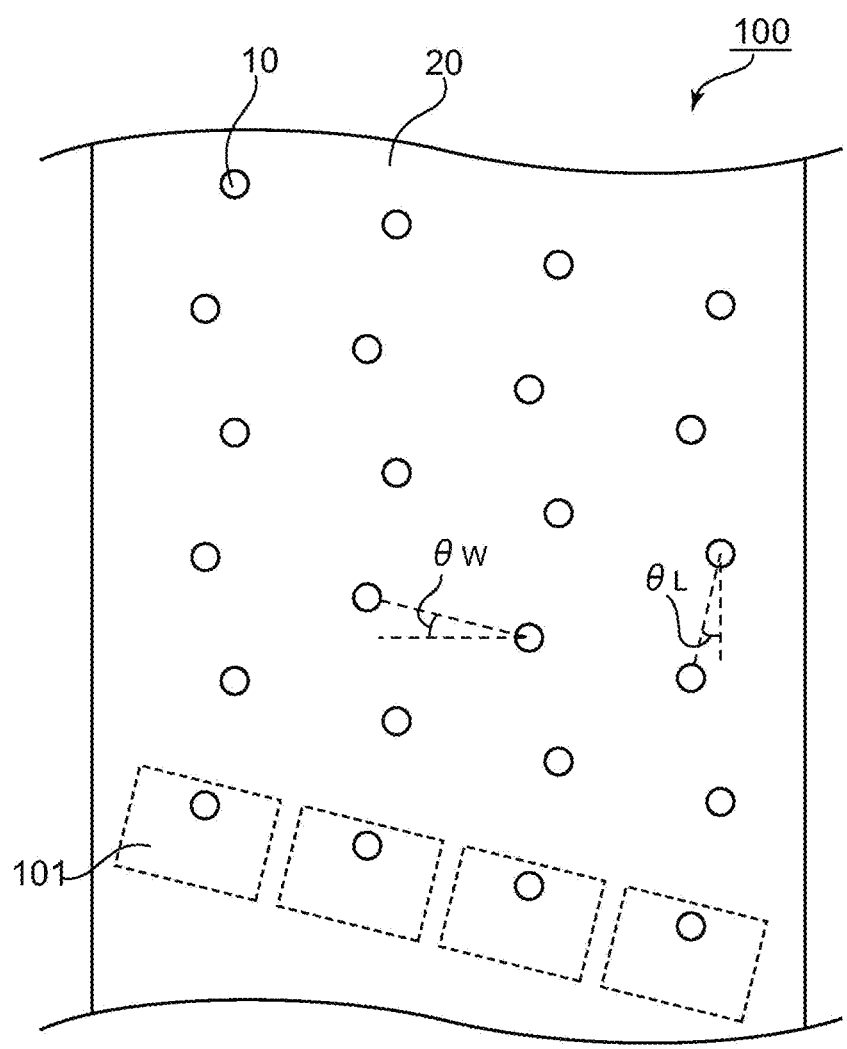
FIG. 2C is a schematic plan view for illustrating still another example of the arrangement pattern of non-polarization portions in the polarizer according to the embodiment of the present invention.

FIG. 2A is a schematic plan view for illustrating an example of the arrangement pattern of the non-polarization portions in the polarizer according to the embodiment of the present invention, FIG. 2B is a schematic plan view for illustrating another example of the arrangement pattern of the non-polarization portions, and FIG. 2C is a schematic plan view for illustrating still another example of the arrangement pattern of the non-polarization portions. In one embodiment, the non-polarization portions 10 are arranged so that, as illustrated in FIG. 2A, a straight line connecting the non-polarization portions adjacent to each other in the lengthwise direction may be substantially parallel to the lengthwise direction, and a straight line connecting the non-polarization portions adjacent to each other in the widthwise direction may be substantially parallel to the widthwise direction. This embodiment corresponds to the arrangement pattern of the non-polarization portions in the polarizer illustrated in FIG. 1. In another embodiment, the non-polarization portions 10 are arranged so that, as illustrated in FIG. 2B, the straight line connecting the non-polarization portions adjacent to each other in the lengthwise direction may be substantially parallel to the lengthwise direction, and the straight line connecting the non-polarization portions adjacent to each other in the widthwise direction may have a predetermined angle $\theta_W$ with respect to the widthwise direction. In still another embodiment, the non-polarization portions 10 are arranged so that, as illustrated in FIG. 2C, the straight line connecting the non-polarization portions adjacent to each other in the lengthwise direction may have a predetermined angle $\theta_L$ with respect to the lengthwise direction, and the straight line connecting the non-polarization portions adjacent to each other in the widthwise direction may have the predetermined angle $\theta_W$ with respect to the widthwise direction. The $\theta_L$ and/or the $\theta_W$ are each/is preferably more than 0° and ±10° or less. Here, the symbol "±" means that both clockwise and counterclockwise directions with respect to a reference direction (the lengthwise direction or the widthwise direction) are included. Each of the embodiments illustrated in FIG. 2B and FIG. 2C has such an advantage as follows. In some image display apparatus, the absorption axis of a polarizer may be required to be arranged while being shifted by up to about 10° with respect to the long side or short side of each of the apparatus for improving its display characteristics. As described later, the absorption axis of the polarizer is expressed in the lengthwise direction or the widthwise direction. Accordingly, according to such construction as described above, in such cases, the directions of the absorption axes of sheets of polarizers 101 cut out of the polarizer 100 can each be precisely controlled to a desired angle, and a variation in absorption axis direction between the polarizers 101 can be significantly suppressed. Needless to say, the arrangement pattern of the non-polarization portions is not limited to the illustrated examples. For example, the non-polarization portions 10 may be arranged so that the straight line connecting the non-polarization portions adjacent to each other in the lengthwise direction may have the predetermined angle $\theta_L$ with respect to the lengthwise direction, and the straight line connecting the non-polarization portions adjacent to each other in the widthwise direction may be substantially parallel to the widthwise direction. In addition, the following may be performed: a plurality of regions are specified in the lengthwise direction of the polarizer 100, and the $\theta_L$ and/or the $\theta_W$ are/is set for each of the regions.

The transmittance of each of the non-polarization portions (e.g., a transmittance measured with light having a wavelength of 550 nm at 23° C.) is preferably 50% or more, more preferably 60% or more, still more preferably 75% or more, particularly preferably 90% or more. With such transmittance, desired transparency as a non-polarization portion can be secured. As a result, when the polarizer is arranged so that the non-polarization portions may each correspond to the camera portion of an image display apparatus, an adverse effect on the photographing performance of its camera can be prevented.

The non-polarization portions 10 may each have any appropriate form as long as the portions can be arranged according to such predetermined pattern as described above and the desired optical characteristics are obtained. In one embodiment, the non-polarization portions are decolored portions formed through partial decoloring. Specifically, the portions are decolored portions each formed by decoloring a predetermined portion of a polarizer intermediate. The decolored portions may be formed by, for example, laser irradiation or a chemical treatment (e.g., an acid treatment or an alkali treatment, or a combination thereof). In another embodiment, the non-polarization portions are throughholes (typically through-holes penetrating the polarizer in its thickness direction). The through-holes may each be formed by, for example, mechanical punching (e.g., punching, chisel punching, a plotter, or a water jet) or the removal of the predetermined portion of the polarizer intermediate (e.g., laser ablation or chemical dissolution). Here, the polarizer intermediate means a polarizer before the formation of the non-polarization portions, and is meant to be distinguished from the polarizer of the present invention having the non-polarization portions. Therefore, herein, the polarizer intermediate may be simply referred to as "polarizer" contextually. A person skilled in the art can easily understand whether the term "polarizer" means the polarizer intermediate or means the polarizer of the present invention with reference to the description given herein. Details about the formation of the non-polarization portions are described in relation to a method of producing a polarizer (section C) to be described later.

Any appropriate shape may be adopted as the plan-view shape of each of the non-polarization portions 10 as long as the shape does not adversely affect the camera performance of an image display apparatus in which the polarizer is used. Specific examples thereof include a circular shape, an elliptical shape, a square shape, a rectangular shape, and a diamond shape. Non-polarization portions each having a desired plan-view shape can be formed by appropriately setting the shapes of the through-holes of a surface protective film to be described in the section C to be described later.

The polarizer 100 typically includes a resin film 20 containing a dichromatic substance. The resin film 20 is, for example, a polyvinyl alcohol-based resin (hereinafter referred to as "PVA-based resin") film.

Examples of the dichromatic substance include iodine and an organic dye. The substances may be used alone or in combination. Of those, iodine is preferably used. This is because of the following reason: for example, when non-polarization portions are formed by decoloring based on a chemical treatment, an iodine complex in the resin film (polarizer) is appropriately reduced, and hence non-polarization portions each having such characteristics as to be appropriate for use in a camera portion can be formed.

The non-polarization portions are preferably low concentration portions each having a relatively low content of the dichromatic substance. Specifically, the portions are low concentration portions each having a content of the dichromatic substance lower than that of any other portion. According to such construction, a problem in terms of quality, such as cracking, delamination (interlayer peeling), or adhesive protrusion, is avoided as compared to the case where the non-polarization portions are formed mechanically (e.g., by a method involving mechanically punching out the portions through the use of chisel punching, a plotter, a water jet, or the like). In addition, the content of the dichromatic substance itself in each of the low concentration portions is low, and hence the transparency of each of the non-polarization portions is satisfactorily maintained as compared to the case where the non-polarization portions are formed by decomposing the dichromatic substance with laser light or the like.

The low concentration portions are portions each having a content of the dichromatic substance lower than that of the other portion. The content of the dichromatic substance in each of the low concentration portions is preferably 1.0 wt % or less, more preferably 0.5 wt % or less, still more preferably 0.2 wt % or less. When the content of the dichromatic substance in each of the low concentration portions falls with in such range, desired transparency can be sufficiently imparted to each of the low concentration portions. When each of the low concentration portions is caused to correspond to, for example, the camera portion of an image display apparatus, photographing performance that is extremely excellent from both the viewpoints of brightness and color tones can be realized. Meanwhile, a lower limit for the content of the dichromatic substance in each of the low concentration portions is typically equal to or less than a detection limit. When iodine is used as the dichromatic substance, the iodine content is determined from, for example, a calibration curve produced in advance from an X-ray intensity measured by X-ray fluorescence analysis through the use of a standard sample.

A difference between the content of the dichromatic substance in the other portion and the content of the dichromatic substance in each of the low concentration portions is preferably 0.5 wt % or more, more preferably 1 wt % or more. When the difference between the contents falls within such range, low concentration portions each having desired transparency can be formed.

The content of an alkali metal and/or an alkaline earth metal in each of the low concentration portions is preferably 3.6 wt % or less, more preferably 2.5 wt % or less, still more preferably 1.0 wt % or less, particularly preferably 0.5 wt % or less. When the content of the alkali metal and/or the alkaline earth metal in each of the low concentration portions falls within such range, the shapes of the low concentration portions formed by contact with a basic solution to be described later can be satisfactorily maintained (i.e., low concentration portions each having excellent dimensional stability can be achieved). The content can be determined from, for example, a calibration curve produced in advance from an X-ray intensity measured by X-ray fluorescence analysis through the use of a standard sample. Such content can be achieved by reducing the amount of the alkali metal and/or the alkaline earth metal in a contact portion in the contact with the basic solution to be described later.

Any appropriate resin may be used as a PVA-based resin forming the PVA-based resin film. Examples of the PVA-based resin include polyvinyl alcohol and an ethylene-vinyl alcohol copolymer. The polyvinyl alcohol is obtained by saponifying polyvinyl acetate. The ethylene-vinyl alcohol copolymer is obtained by saponifying an ethylene-vinyl acetate copolymer. The saponification degree of the PVA-based resin is typically from 85 mol % to 100 mol %, preferably from 95.0 mol % to 99.95 mol %, more preferably from 99.0 mol % to 99.93 mol %. The saponification degree may be determined in conformity with JIS K 6726-1994. The use of the PVA-based resin having such saponification degree can provide a polarizer excellent in durability. When the saponification degree is excessively high, the resin may gel.

The average polymerization degree of the PVA-based resin may be appropriately selected in accordance with purposes. The average polymerization degree is typically from 1,000 to 10,000, preferably from 1,200 to 4,500, more preferably from 1,500 to 4,300. The average polymerization degree may be determined in conformity with JIS K 6726-1994.

The polarizer (except the non-polarization portions) preferably shows absorption dichroism at any wavelength in the wavelength range of from 380 nm to 780 nm. The single axis transmittance (Ts) of the polarizer (except the non-polarization portions) is preferably 39% or more, more preferably 39.5% or more, still more preferably 40% or more, particularly preferably 40.5% or more. A theoretical upper limit for the single axis transmittance is 50%, and a practical upper limit therefor is 46%. In addition, the single axis transmittance (Ts) is a Y value measured with the two-degree field of view (C light source) of JIS Z 8701 and subjected to visibility correction, and may be measured with, for example, a microspectroscopic system (manufactured by Lambda Vision Inc., LVmicro). The polarization degree of the polarizer (except the non-polarization portions) is preferably 99.9% or more, more preferably 99.93% or more, still more preferably 99.95% or more.

The thickness of the polarizer (resin film) may be set to any appropriate value. The thickness is preferably 30 μm or less, more preferably 25 μm or less, still more preferably 20 μm or less, particularly preferably 10 μm or less. Meanwhile, the thickness is preferably 0.5 μm or more, more preferably 1 μm or more. With such thickness, a polarizer having excellent durability and excellent optical characteristics can be obtained. As the thickness of the polarizer (resin film) becomes smaller, the non-polarization portions can be formed more satisfactorily. For example, when the non-polarization portions are formed by decoloring based on a chemical treatment, the time period for which a decoloring liquid and the resin film (polarizer) are brought into contact with each other can be shortened. Specifically, non-polarization portions each having a higher transmittance can be formed in a shorter time period.

The thickness of a portion with which the decoloring liquid (e.g., a basic solution) has been brought into contact can be smaller than that of any other portion. The tendency can be strengthened by increasing the transmittance of each of the non-polarization portions to be obtained by the decoloring. When the thickness of the resin film is reduced, a step difference between each of the non-polarization portions and any other portion can be reduced while the high transmittance (preferably 90% or more) of each of the non-polarization portions is achieved. Thus, an inconvenience that may be caused by the step difference can be prevented. Possible examples of the inconvenience include the following inconveniences: when the long polarizer is wound in a roll shape, the step difference between each of the non-polarization portions and any other portion is transferred as a winding trace onto a portion where a part of the polarizer is superimposed on another part thereof; air bubbles occur owing to the step difference between each of the non-polarization portions and any other portion at the time of the bonding of the polarizer to any other constituent member, such as a protective film; and the step difference is visually recognized in a final product. The prevention of any such inconvenience may be capable of contributing to the suppression of a variation in quality between polarizers to be finally used, the polarizers being obtained by cutting the polarizer of the present invention. It is assumed that such effect can be significant, for example, when the transmittance of each of the non-polarization portions is 90% or more and/or when the content of the dichromatic substance in each of the portions is 0.2 wt % or less. The fact that the transmittance of each of the non-polarization portions is as high as 90% or more can also contribute to the suppression of the variation in quality between the polarizers to be finally used. Specifically, in the case where the non-polarization portions are formed by the contact of the decoloring liquid, when a decoloring degree is insufficient, a variation in transmittance between the non-polarization portions to be obtained is liable to occur. However, the decolored states of the non-polarization portions can be stably controlled by setting the transmittance to 90% or more and/or by setting the content of the dichromatic substance to 0.2 wt % or less (by strengthening the decoloring degree).

In one embodiment, the non-polarization portions are thin portions thinner than any other portion. For example, the thin portions are each obtained by forming a recessed portion having a recessed surface on one surface side of the polarizer. In this case, the step difference between each of the non-polarization portions and any other portion (depth of the recessed portion) is, for example, 0.02 μm or more. Meanwhile, the step difference is preferably 2 μm or less, more preferably 1 μm or less. When the non-polarization portions are formed by decoloring to be described later (e.g., when the transmittance of each of the non-polarization portions is 90% or more and/or when the content of the dichromatic substance in each of the portions is 0.2 wt % or less), such step difference is formed in some cases. However, when an upper limit for the step difference falls within such range, an inconvenience due to the step difference, such as a winding trace due to roll forming, may be satisfactorily suppressed. As a result, the variation in quality between the polarizers to be finally used, the polarizers being obtained by cutting the polarizer of the present invention, can be significantly suppressed. The term "step difference (depth of the recessed portion)" as used herein refers to the depth of the deepest portion of the recessed portion.

The recessed portion having a recessed surface on one surface side is formed by, for example, causing a decoloring liquid to act only from one surface side of the polarizer (polarizer intermediate). When the depth of the recessed portion to be formed after the decoloring treatment is set within the above-mentioned range, a treatment after the decoloring to be described later can be uniformly performed. In addition, when the recessed portion can be formed only on the one surface side, it is assumed that the occurrence of an inconvenience due to the step difference, such as a winding trace due to roll forming, is prevented, and hence the variation in quality between the polarizers to be finally used can be suppressed.

The absorption axis of the polarizer may be set to any appropriate direction in accordance with purposes. The direction of the absorption axis may be, for example, the lengthwise direction or the widthwise direction. A polarizer having an absorption axis in its lengthwise direction has an advantage in that the polarizer is excellent in production efficiency. A polarizer having an absorption axis in its widthwise direction has an advantage in that the polarizer can be laminated together with, for example, a retardation film having a slow axis in its lengthwise direction by a so-called roll-to-roll process. In one embodiment, the absorption axis is substantially parallel to the lengthwise direction or the widthwise direction, and both end portions of the polarizer are subjected to slitting parallel to the lengthwise direction. According to such construction, when a cutting operation is performed with reference to an end surface of the polarizer, a plurality of polarizers each having a non-polarization portion and each having an absorption axis in an appropriate direction can be easily produced.

B. Polarizing Plate

Figure 3:
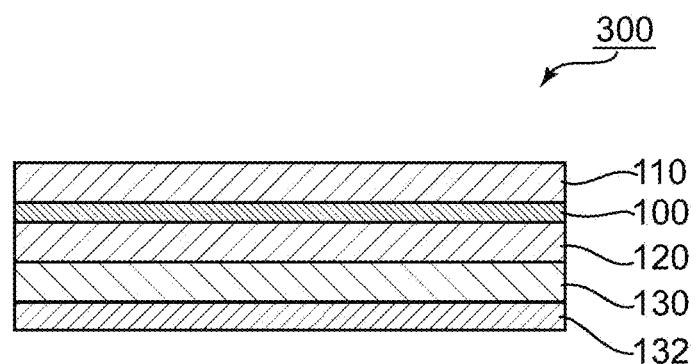
FIG. 3 is a schematic sectional view of a polarizing plate according to one embodiment of the present invention.

The polarizer 100 may be practically provided as a polarizing plate. Therefore, the present invention can also provide a polarizing plate. The polarizing plate is long as in the polarizer. When the polarizing plate is used in an image display apparatus, the polarizing plate may be cut in the manner described for the polarizer in the section A. FIG. 3 is a schematic sectional view of a polarizing plate according to one embodiment of the present invention. A polarizing plate 300 includes the polarizer 100, and protective films 110 and 120 arranged on both sides of the polarizer 100. Although the protective films are arranged on both sides of the polarizer in the illustrated example, a protective film may be arranged only on one side thereof. As materials for forming the protective film, there are given, for example, a cellulose-based resin, such as diacetyl cellulose or triacetyl cellulose, a (meth)acrylic resin, a cycloolefin-based resin, an olefin-based resin, such as polypropylene, an ester-based resin, such as a polyethylene terephthalate-based resin, a polyamide-based resin, a polycarbonate-based resin, and copolymer resins thereof. One of the protective films 110 and 120 may be omitted in accordance with purposes and a desired construction. The simple term "protective film" as used herein means a polarizer protective film like the protective film 110 or 120, and is different from a surface protective film (film configured to temporarily protect the polarizing plate at the time of an operation) to be described in the section C.

The thickness of the protective film is typically from 10 μm to 100 μm. The protective film is typically laminated on the polarizer through intermediation of an adhesion layer (specifically an adhesive layer or a pressure-sensitive adhesive layer). The adhesive layer is typically formed of a PVA-based adhesive or an active energy ray-curable adhesive. The pressure-sensitive adhesive layer is typically formed of an acrylic pressure-sensitive adhesive. In one embodiment, the thickness of the protective film is 80 µm or less. The use of a protective film having such thickness can contribute to the thinning of the polarizing plate to be obtained. Meanwhile, when a long polarizing plate obtained by arranging a protective film having such thickness on the other surface side of the polarizer having the recessed portions formed on the one surface side is wound in a roll shape, an inconvenience due to the step difference, such as the transfer of the recessed portions as winding traces onto the protective film, may be liable to occur. In such embodiment, a merit of reducing the depths of the recessed portions can be significantly obtained.

The polarizing plate 300 practically includes a pressure-sensitive adhesive layer 130 as an outermost layer. The pressure-sensitive adhesive layer 130 typically serves as an outermost layer on an image display apparatus side. A separator 132 is temporarily bonded to the pressure-sensitive adhesive layer 130 in a peelable manner to protect the pressure-sensitive adhesive layer until the layer is actually used, and to enable roll forming.

The polarizing plate 300 may further include any appropriate optical functional layer in accordance with purposes. Typical examples of the optical functional layer include a retardation film (optical compensation film) and a surface-treated layer. For example, a retardation film may be arranged between the protective film 120 and the pressure-sensitive adhesive layer 130 (not shown). The optical characteristics (e.g., a refractive index ellipsoid, an in-plane retardation, and a thickness direction retardation) of the retardation film may be appropriately set in accordance with, for example, purposes and the characteristics of an image display apparatus. For example, when the image display apparatus is a liquid crystal display apparatus of an IPS mode, a retardation film having a refractive index ellipsoid of $nx>ny>nz$ and a retardation film having a refractive index ellipsoid of $nz>nx>ny$ may be arranged. The retardation film may also serve as a protective film. In this case, the protective film 120 may be omitted. In contrast, the protective film 120 may have an optical compensation function (i.e., the film may have an appropriate refractive index ellipsoid, an appropriate in-plane retardation, and an appropriate thickness direction retardation that are in accordance with purposes). The symbol "nx" represents a refractive index in the direction in which a refractive index in a film plane becomes maximum (i.e., a slow axis direction), the symbol "ny" represents a refractive index in a direction perpendicular to the slow axis in the film plane, and the symbol "nz" represents a refractive index in a thickness direction.

A surface-treated layer may be arranged outside the protective film 110 (not shown). Typical examples of the surface-treated layer include a hard coat layer, an antireflection layer, and an anti-glare layer. The surface-treated layer is preferably, for example, a layer having a low moisture permeability for the purpose of improving the humidification durability of the polarizer. The hard coat layer is arranged for the purpose of, for example, preventing the surface of the polarizing plate from being flawed. The hard coat layer may be formed by, for example, a system involving adding, to the surface, a cured coating film based on an appropriate UV-curable resin, such as an acrylic UV-curable resin or a silicone-based UV-curable resin, the cured coating film being excellent in hardness, sliding characteristic, and the like. The hard coat layer preferably has a pencil hardness of 2H or more. The antireflection layer is a low-reflection layer to be arranged for the purpose of preventing the reflection of ambient light on the surface of the polarizing plate. Examples of the antireflection layer include a thin-layer type disclosed in JP 2005-248173 A that prevents the reflection through the utilization of a reflected light-canceling effect exhibited by an optical interferential action and a surface structure type disclosed in JP 2011-2759 A that provides the surface with a fine structure to express a low reflectance. The anti-glare layer is arranged for the purpose of, for example, preventing the inhibition of the viewing of light transmitted through the polarizing plate due to the reflection of the ambient light on the surface of the polarizing plate. The anti-glare layer is formed by, for example, providing the surface with a fine uneven structure according to an appropriate system, such as a surface-roughening system based on a sandblast system or an embossing system, or a system involving compounding transparent fine particles. The anti-glare layer may also serve as a diffusion layer (e.g., a viewing angle-broadening function) for diffusing the light transmitted through the polarizing plate to broaden a viewing angle or the like. The surface of the protective film 110 may be subjected to a similar surface treatment instead of the arrangement of the surface-treated layer.

In a preferred embodiment, the polarizer is subjected to the cutting into the predetermined size in the state of a polarizing plate. Specifically, the polarizing plate is cut into the predetermined size to be used for producing a plurality of polarizing plate pieces each including a polarizer having a non-polarization portion and a protective film arranged on at least one side of the polarizer.

C. Method of Producing Polarizer

A method of producing a polarizer of the present invention is described below.

C-1. Production of Polarizer

A resin film (typically a PVA-based resin film) constituting the polarizer may be a single film, or may be a resin layer (typically a PVA-based resin layer) formed on a resin substrate. The PVA-based resin layer may be formed by applying an application liquid containing a PVA-based resin onto the resin substrate, or may be formed by laminating the PVA-based resin film onto the resin substrate. The case where the polarizer is the PVA-based resin layer formed on the resin substrate is specifically described below. Here, the case where the PVA-based resin layer is formed by application is described, but the same holds true for the case where the PVA-based resin film is laminated. In the case where the polarizer is a single PVA-based resin film, the polarizer may be produced by a method well-known and commonly used in the art, and hence detailed description of the case is omitted.

C-1-1. Production of Laminate of Resin Substrate and PVA-Based Resin Layer

A laminate of the resin substrate and the PVA-based resin layer is produced by applying the application liquid containing the PVA-based resin onto the resin substrate, and drying the liquid to form the PVA-based resin layer.

Any appropriate thermoplastic resin may be adopted as a formation material for the resin substrate. Examples of the thermoplastic resin include: an ester-based resin, such as a polyethylene terephthalate-based resin; a cycloolefin-based resin, such as a norbornene-based resin; an olefin-based resin, such as polypropylene; a polyamide-based resin; a polycarbonate-based resin; and copolymer resins thereof. Of those, a norbornene-based resin and an amorphous polyethylene terephthalate-based resin are preferred.

In one embodiment, an amorphous (uncrystallized) polyethylene terephthalate-based resin is preferably used. In particular, a non-crystalline (hardly crystallizable) polyethylene terephthalate-based resin is preferably used. Specific examples of the non-crystalline polyethylene terephthalate-based resin include: a copolymer further containing isophthalic acid as a dicarboxylic acid; and a copolymer further containing cyclohexanedimethanol as a glycol.

When an underwater stretching mode is adopted in stretching to be described later, the resin substrate absorbs water and the water can function like a plasticizer to plasticize the substrate. As a result, a stretching stress can be significantly reduced and hence the laminate can be stretched at a high ratio. Accordingly, stretchability more excellent than that at the time of in-air stretching can be achieved. As a result, a polarizer having excellent optical characteristics can be produced. In one embodiment, the water absorption ratio of the resin substrate is preferably 0.2% or more, more preferably 0.3% or more. Meanwhile, the water absorption ratio of the resin substrate is preferably 3.0% or less, more preferably 1.0% or less. The use of such resin substrate can prevent an inconvenience, such as the deterioration of the external appearance of the polarizer to be obtained due to a remarkable reduction in dimensional stability at the time of the production. In addition, the use can prevent the rupture of the substrate at the time of underwater stretching and the peeling of the PVA-based resin layer from the resin substrate. The water absorption ratio of the resin substrate may be adjusted by, for example, introducing a modification group into the formation material. The water absorption ratio is a value determined in conformity with JIS K 7209.

The glass transition temperature (Tg) of the resin substrate is preferably 170° C. or less. The use of such resin substrate can sufficiently secure the stretchability of the laminate while suppressing the crystallization of the PVA-based resin layer. Further, in consideration of the plasticization of the resin substrate by water and satisfactory performance of the underwater stretching, the glass transition temperature is more preferably 120° C. or less. In one embodiment, the glass transition temperature of the resin substrate is preferably 60° C. or more. The use of such resin substrate prevents an inconvenience, such as the deformation (e.g., the occurrence of unevenness, a sag, or a wrinkle) of the resin substrate at the time of the application and drying of the application liquid containing the PVA-based resin, and hence enables satisfactory production of the laminate. In addition, the use enables satisfactory performance of the stretching of the PVA-based resin layer at a suitable temperature (e.g., about 60° C.). In another embodiment, the glass transition temperature may be lower than 60° C. as long as the resin substrate does not deform at the time of the application and drying of the application liquid containing the PVA-based resin. The glass transition temperature of the resin substrate may be adjusted by, for example, introducing a modification group into the formation material or incorporating a crystallized material into the formation material and heating the material. The glass transition temperature (Tg) is a value determined in conformity with JIS K 7121.

The thickness of the resin substrate before the stretching is preferably from 20 μm to 300 μm, more preferably from 50 μm to 200 μm. When the thickness is less than 20 μm, it may become difficult to form the PVA-based resin layer. When the thickness is more than 300 μm, there is a risk in that, for example, in the underwater stretching, a long time period is required for the resin substrate to absorb water, and an excessively large load is required for the stretching.

The PVA-based resin forming the PVA-based resin layer is as described in the section A.

The application liquid is typically a solution in which the PVA-based resin is dissolved in a solvent. Examples of the solvent include water, dimethyl sulfoxide, dimethylformamide, dimethylacetamide, N-methylpyrrolidone, various glycols, polyhydric alcohols, such as trimethylolpropane, and amines, such as ethylenediamine and diethylenetriamine. Those solvents may be used alone or in combination. Of those, water is preferred. The PVA-based resin concentration of the solution is preferably from 3 parts by weight to 20 parts by weight with respect to 100 parts by weight of the solvent. Such resin concentration enables the formation of a uniform applied film closely adhering to the resin substrate.

The application liquid may be compounded with an additive. Examples of the additive include a plasticizer and a surfactant. Examples of the plasticizer include polyhydric alcohols, such as ethylene glycol and glycerin. The surfactant is, for example, a nonionic surfactant. Any such additive may be used for the purpose of further improving the uniformity, dyeability, and stretchability of the PVA-based resin layer to be obtained.

Any appropriate method may be adopted as a method of applying the application liquid. Examples thereof include a roll coating method, a spin coating method, a wire bar coating method, a dip coating method, a die coating method, a curtain coating method, a spray coating method, and a knife coating method (such as a comma coating method).

The temperature at which the application liquid is applied and dried is preferably 50° C. or more.

The thickness of the PVA-based resin layer before the stretching is preferably from 3 μm to 40 μm, more preferably from 3 μm to 20 μm.

Before the formation of the PVA-based resin layer, the resin substrate may be subjected to a surface treatment (e.g., a corona treatment), or an easy-adhesion layer may be formed on the resin substrate. The performance of any such treatment can improve adhesiveness between the resin substrate and the PVA-based resin layer.

C-1-2. Stretching of Laminate

Any appropriate method may be adopted as a method of stretching the laminate. Specifically, fixed-end stretching may be adopted, or free-end stretching (e.g., a method involving passing the laminate between rolls having different peripheral speeds to uniaxially stretch the laminate) may be adopted. Of those, free-end stretching is preferred.

The stretching direction of the laminate may be appropriately set. In one embodiment, the stretching is performed in the lengthwise direction of a long laminate. As a result, the absorption axis of the polarizer to be obtained can be expressed in the lengthwise direction. In this case, the method involving passing the laminate between the rolls having different peripheral speeds to stretch the laminate is typically adopted. In another embodiment, the stretching is performed in the widthwise direction of the long laminate. As a result, the absorption axis of the polarizer to be obtained can be expressed in the widthwise direction. In this case, a method involving stretching the laminate with a tenter stretching machine is typically adopted.

A stretching mode is not particularly limited, and may be an in-air stretching mode, or may be an underwater stretching mode. Of those, an underwater stretching mode is preferred. According to the underwater stretching mode, the stretching can be performed at a temperature lower than the glass transition temperature (typically about 80° C.) of the resin substrate or the PVA-based resin layer, and hence the PVA-based resin layer can be stretched at a high ratio while its crystallization is suppressed. As a result, a polarizer having excellent optical characteristics can be produced.

The stretching of the laminate may be performed in one stage, or may be performed in a plurality of stages. When the stretching is performed in a plurality of stages, for example, the free-end stretching and the fixed-end stretching may be combined, or the underwater stretching mode and the in-air stretching mode may be combined. In addition, when the stretching is performed in the plurality of stages, the stretching ratio (maximum stretching ratio) of the laminate to be described later is the product of stretching ratios at the respective stages.

The stretching temperature of the laminate may be set to any appropriate value in accordance with, for example, the formation material for the resin substrate and the stretching mode. When the in-air stretching mode is adopted, the stretching temperature is preferably equal to or more than the glass transition temperature (Tg) of the resin substrate, more preferably equal to or more than Tg+10° C., particularly preferably equal to or more than Tg+15° C. Meanwhile, the stretching temperature of the laminate is preferably 170° C. or less. When the stretching is performed at such temperature, rapid progress of the crystallization of the PVA-based resin is suppressed, and hence an inconvenience due to the crystallization (e.g., the inhibition of the orientation of the PVA-based resin layer by the stretching) can be suppressed.

When the underwater stretching mode is adopted, the liquid temperature of a stretching bath is preferably from 40° C. to 85° C., more preferably from 50° C. to 85° C. At such temperature, the stretching can be performed at a high ratio while the dissolution of the PVA-based resin layer is suppressed. Specifically, as described above, the glass transition temperature (Tg) of the resin substrate is preferably 60° C. or more in relation to the formation of the PVA-based resin layer. In this case, when the stretching temperature is less than 40° C., there is a risk in that the stretching cannot be satisfactorily performed even in consideration of the plasticization of the resin substrate by water. Meanwhile, as the temperature of the stretching bath increases, there is a risk in that the solubility of the PVA-based resin layer is raised and hence excellent optical characteristics cannot be obtained. The time period for which the laminate is immersed in the stretching bath is preferably from 15 seconds to 5 minutes.

When the underwater stretching mode is adopted, the laminate is preferably stretched while being immersed in an aqueous solution of boric acid (boric acid underwater stretching). The use of the aqueous solution of boric acid as the stretching bath can impart, to the PVA-based resin layer, rigidity enabling the layer to withstand a tension to be applied at the time of the stretching and water resistance preventing the layer from dissolving in water. Specifically, boric acid can produce a tetrahydroxyboric acid anion in the aqueous solution to cross-link with the PVA-based resin through a hydrogen bond. As a result, the rigidity and the water resistance are imparted to the PVA-based resin layer, and hence the layer can be satisfactorily stretched. Accordingly, a polarizer having excellent optical characteristics can be produced.

The aqueous solution of boric acid is preferably obtained by dissolving boric acid and/or a borate in water serving as a solvent. The concentration of boric acid is preferably from 1 part by weight to 10 parts by weight with respect to 100 parts by weight of water. The setting of the boric acid concentration to 1 part by weight or more can effectively suppress the dissolution of the PVA-based resin layer, and hence enables the production of a polarizer having higher characteristics. In addition to boric acid or the borate, an aqueous solution obtained by dissolving, for example, a boron compound, such as borax, and glyoxal or glutaraldehyde in a solvent may also be used.

When the PVA-based resin layer is caused to adsorb a dichromatic substance (typically iodine) by dyeing to be described later in advance, the stretching bath (aqueous solution of boric acid) is preferably compounded with an iodide. The compounding of the bath with the iodide can suppress the elution of iodine that the PVA-based resin layer has been caused to adsorb. Examples of the iodide include potassium iodide, lithium iodide, sodium iodide, zinc iodide, aluminum iodide, lead iodide, copper iodide, barium iodide, calcium iodide, tin iodide, and titanium iodide. Of those, potassium iodide is preferred. The concentration of the iodide is preferably from 0.05 part by weight to 15 parts by weight, more preferably from 0.5 part by weight to 8 parts by weight with respect to 100 parts by weight of water.

The stretching ratio (maximum stretching ratio) of the laminate is preferably 5.0 times or more with respect to the original length of the laminate. Such high stretching ratio can be achieved by adopting, for example, the underwater stretching mode (boric acid underwater stretching). The term "maximum stretching ratio" as used herein refers to a stretching ratio immediately before the rupture of the laminate, and refers to a value lower than a separately determined value for the stretching ratio at which the laminate is ruptured by 0.2.

In a preferred embodiment, after the laminate has been subjected to in-air stretching at a high temperature (of, for example, 95° C. or more), the boric acid underwater stretching and the dyeing to be described later are performed. Such in-air stretching is hereinafter referred to as "in-air auxiliary stretching" because the stretching may be regarded as stretching preliminary or auxiliary to the boric acid underwater stretching.

When the in-air auxiliary stretching is combined with the boric acid underwater stretching, the laminate can be stretched at a higher ratio in some cases. As a result, a polarizer having more excellent optical characteristics (e.g., a polarization degree) can be produced. For example, when a polyethylene terephthalate-based resin is used as the resin substrate, in the case where the in-air auxiliary stretching and the boric acid underwater stretching are combined, the laminate can be stretched, while the orientation of the resin substrate is suppressed, to a large extent as compared to the case where the stretching is performed only by the boric acid underwater stretching. As the orientation property of the resin substrate is improved, a stretching tension increases, and hence it becomes difficult to stably stretch the laminate or the laminate is ruptured. Accordingly, when the laminate is stretched while the orientation of the resin substrate is suppressed, the laminate can be stretched at a higher ratio.

In addition, when the in-air auxiliary stretching is combined with the boric acid underwater stretching, the orientation property of the PVA-based resin is improved, and hence the orientation property of the PVA-based resin can be improved even after the boric acid underwater stretching. Specifically, the following assumption is made: when the orientation property of the PVA-based resin is improved by the in-air auxiliary stretching in advance, the PVA-based resin easily cross-links with boric acid at the time of the boric acid underwater stretching, and the laminate is stretched under a state in which boric acid serves as anode, and hence the orientation property of the PVA-based resin is improved even after the boric acid underwater stretching. As a result, a polarizer having excellent optical characteristics (e.g., a polarization degree) can be produced.

The stretching ratio of the laminate in the in-air auxiliary stretching is preferably 3.5 times or less. The stretching temperate in the in-air auxiliary stretching is preferably equal to or more than the glass transition temperature of the PVA-based resin. The stretching temperature is preferably from 95° C. to 150° C. The maximum stretching ratio of the laminate when the in-air auxiliary stretching and the boric acid underwater stretching are combined is preferably 5.0 times or more, more preferably 5.5 times or more, still more preferably 6.0 times or more with respect to the original length of the laminate.

C-1-3. Dyeing

The dyeing is typically performed by causing the PVA-based resin layer to adsorb the dichromatic substance (preferably iodine) A method for the adsorption is, for example, a method involving immersing the PVA-based resin layer (laminate) in a dyeing liquid containing iodine, a method involving applying the dyeing liquid to the PVA-based resin layer, or a method involving spraying the dyeing liquid on the PVA-based resin layer. Of those, a method involving immersing the laminate in the dyeing liquid is preferred. This is because iodine can satisfactorily adsorb to the laminate.

The dyeing liquid is preferably an aqueous solution of iodine. The compounding amount of iodine is preferably from 0.1 part by weight to 0.5 part by weight with respect to 100 parts by weight of water. In order that the solubility of iodine in water may be increased, the aqueous solution of iodine is preferably compounded with an iodide. Specific examples of the iodide are as described above. The compounding amount of the iodide is preferably from 0.02 part by weight to 20 parts by weight, more preferably from 0.1 part by weight to 10 parts by weight with respect to 100 parts by weight of water. The liquid temperature of the dyeing liquid at the time of the dyeing is preferably from 20° C. to 50° C. in order that the dissolution of the PVA-based resin may be suppressed. When the PVA-based resin layer is immersed in the dyeing liquid, an immersion time is preferably from 5 seconds to 5 minutes in order that the transmittance of the PVA-based resin layer may be secured. In addition, the dyeing conditions (the concentrations, the liquid temperature, and the immersion time) may be set so that the polarization degree or single axis transmittance of the polarizer to be finally obtained may fall within a predetermined range. In one embodiment, the immersion time is set so that the polarization degree of the polarizer to be obtained may be 99.98% or more. In another embodiment, the immersion time is set so that the single axis transmittance of the polarizer to be obtained may be from 40% to 44%.

A dyeing treatment may be performed at any appropriate timing. When the underwater stretching is performed, the treatment is preferably performed before the underwater stretching.

C-1-4. Other Treatments

The laminate may be appropriately subjected to a treatment for turning its PVA-based resin layer into a polarizer (or a polarizer intermediate) in addition to the stretching and the dyeing. Examples of the treatment for turning the layer into the polarizer include an insolubilizing treatment, a cross-linking treatment, a washing treatment, and a drying treatment. The number of times of each of those treatments, the order in which the treatments are performed, and the like are not particularly limited.

The insolubilizing treatment is typically performed by immersing the PVA-based resin layer in an aqueous solution of boric acid. The performance of the insolubilizing treatment can impart water resistance to the PVA-based resin layer. The concentration of boric acid in the aqueous solution is preferably from 1 part by weight to 4 parts by weight with respect to 100 parts by weight of water. The liquid temperature of the insolubilizing bath (aqueous solution of boric acid) is preferably from 20° C. to 50° C. The insolubilizing treatment is preferably performed before the underwater stretching and the dyeing treatment.

The cross-linking treatment is typically performed by immersing the PVA-based resin layer in an aqueous solution of boric acid. The performance of the cross-linking treatment can impart water resistance to the PVA-based resin layer. The concentration of boric acid in the aqueous solution is preferably from 1 part by weight to 5 parts by weight with respect to 100 parts by weight of water. In addition, when the cross-linking treatment is performed after the dyeing treatment, the solution is preferably further compounded with an iodide. The compounding of the solution with the iodide can suppress the elution of iodine that the PVA-based resin layer has been caused to adsorb. The compounding amount of the iodide is preferably from 1 part by weight to 5 parts by weight with respect to 100 parts by weight of water. Specific examples of the iodide are as described above. The liquid temperature of the cross-linking bath (aqueous solution of boric acid) is preferably from 20° C. to 60° C. The cross-linking treatment is preferably performed before the underwater stretching. In a preferred embodiment, the dyeing treatment, the cross-linking treatment, and the underwater stretching are performed in the stated order.

The washing treatment is typically performed by immersing the PVA-based resin layer in an aqueous solution of potassium iodide. A drying temperature in the drying treatment is preferably from 30° C. to 100° C.

The polarizer (polarizer intermediate) is formed on the resin substrate as described above. The bonding of a protective film and/or the peeling of the resin substrate are/is performed as required. In one embodiment, the protective film is bonded to the polarizer surface of a laminate of the resin substrate and the polarizer by the roll-to-roll process, and then the resin substrate is peeled. Thus, a laminate (polarizing plate) of the polarizer and the protective film is obtained. The protective film in the polarizing plate may typically correspond to the protective film (protective film on the image display apparatus side) 120 of FIG. 3. As described above, the protective film may have an optical compensation function.

C-2. Formation of Non-Polarization Portions

Next, the polarizer of the present invention is obtained by forming non-polarization portions at predetermined positions of the polarizer intermediate obtained in the section C-1. When the polarizer (polarizer intermediate) is formed from the PVA-based resin layer applied onto the resin substrate, the laminate of the resin substrate and the polarizer, or the laminate (polarizing plate) of the protective film and the polarizer is typically subjected to the formation of the non-polarization portions. When the polarizer (polarizer intermediate) is a single resin film, the polarizer alone, or the laminate (polarizing plate) of the protective film and the polarizer is typically subjected to the formation of the non-polarization portions. The formation of the non-polarization portions is specifically described below. The case where the non-polarization portions are formed in the polarizer (polarizer intermediate) by decoloring based on a chemical treatment (hereinafter sometimes referred to as "chemical decoloring treatment") in the laminate of the protective film and the polarizer (hereinafter simply referred to as "polarizing plate" in this section) is described as a typical example. It is apparent to a person skilled in the art that the same procedure is applicable also to a polarizer intermediate having any other construction (e.g., a polarizer intermediate that is a single resin film).

Figure 4:
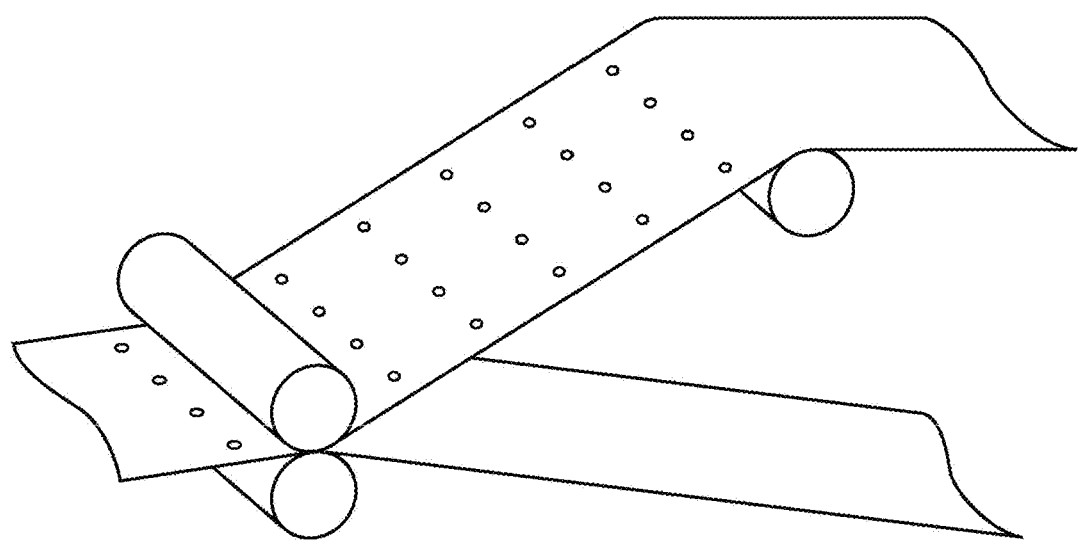
FIG. 4 is a schematic perspective view for illustrating bonding between a polarizer and a first surface protective film in a method of producing a polarizer according to an embodiment of the present invention.

As illustrated in FIG. 4, a surface protective film having through-holes arranged according to a predetermined pattern is bonded to a surface of the polarizing plate on the polarizer side by the roll-to-roll process. The term "roll-to-roll process" as used herein means that roll-shaped films are bonded to each other with their lengthwise directions aligned with each other while being conveyed. The surface protective film having the through-holes is bonded to the polarizer through intermediation of any appropriate pressure-sensitive adhesive in a peelable manner. When the surface protective film having the through-holes is used, a decoloring treatment based on immersion in a decoloring liquid can be performed, and hence the polarizer of the present invention can be obtained with extremely high production efficiency. The surface protective film having the through-holes may be referred to as "first surface protective film" for convenience.

As described above, the first surface protective film has the through-holes arranged according to the predetermined pattern. The positions at which the through-holes are arranged correspond to the positions of the polarizer (polarizer intermediate) at which the non-polarization portions are formed. The arrangement pattern of the through-holes illustrated in FIG. 4 corresponds to the arrangement pattern of the non-polarization portions illustrated in FIG. 2A. The through-holes may each have any appropriate shape. The shapes of the through-holes correspond to the plan-view shapes of the non-polarization portions to be formed. The through-holes may each be formed by, for example, mechanical punching (e.g., punching, chisel punching, a plotter, or a water jet) or the removal of a predetermined portion of the film (e.g., laser ablation or chemical dissolution).

The first surface protective film is preferably a film having a high hardness (e.g., a modulus of elasticity). This is because the deformation of the through-holes at the time of the conveyance and/or the bonding can be prevented. As materials for forming the first surface protective film, there are given, for example: an ester-based resin, such as a polyethylene terephthalate-based resin; a cycloolefin-based resin, such as a norbornene-based resin; an olefin-based resin, such as polypropylene; a polyamide-based resin; a polycarbonate-based resin; and copolymer resins thereof. Of those, an ester-based resin (especially a polyethylene-terephthalate-based resin) is preferred. Such material has an advantage in that its modulus of elasticity is sufficiently high, and hence the deformation of the through-holes hardly occurs even when a tension is applied at the time of the conveyance and/or the bonding.

The thickness of the first surface protective film is typically from 20 µm to 250 µm, preferably from 30 µm to 150 µm. Such thickness has an advantage in that the deformation of the through-holes hardly occurs even when a tension is applied at the time of the conveyance and/or the bonding.

The modulus of elasticity of the first surface protective film is preferably from 2.2 kN/mm$^2$ to 4.8 kN/mm$^2$. When the modulus of elasticity of the first surface protective film falls within such range, the following advantage is obtained: the deformation of the through-holes hardly occurs even when a tension is applied at the time of the conveyance and/or the bonding. The modulus of elasticity is measured in conformity with JIS K 6781.

The tensile elongation of the first surface protective film is preferably from 90% to 170%. When the tensile elongation of the first surface protective film falls within such range, the following advantage is obtained: the film is hardly ruptured during the conveyance. The tensile elongation is measured in conformity with JIS K 6781.

Meanwhile, a second surface protective film is bonded to a surface of the polarizing plate on the protective film side by the roll-to-roll process. The second surface protective film is bonded to the protective film through intermediation of any appropriate pressure-sensitive adhesive in a peelable manner. The use of the second surface protective film enables appropriate protection of the polarizing plate (polarizer intermediate/protective film) in the decoloring treatment based on immersion. The same film as the first surface protective film except that no through-holes are arranged may be used as the second surface protective film. Further, a soft (e.g., low-modulus of elasticity) film like a polyolefin (e.g., polyethylene) film may also be used as the second surface protective film. The second surface protective film may be bonded simultaneously with the first surface protective film, may be bonded before the bonding of the first surface protective film, or may be bonded after the bonding of the first surface protective film. The second surface protective film is preferably bonded before the bonding of the first surface protective film. Such procedure has the following advantages: the protective film is prevented from being flawed; and the through-holes formed in the first surface protective film are prevented from being transferred as traces onto the protective film at the time of its winding. When the second surface protective film is bonded before the bonding of the first surface protective film, for example, the following may be performed. A laminate of the polarizer protective film and the second surface protective film is produced, and the laminate is bonded to the laminate of the resin substrate and the polarizer. After that, the resin substrate is peeled and the first surface protective film is bonded to the peeled surface.

Next, as illustrated in FIG. 5, the laminate of the first surface protective film, the polarizer (polarizer intermediate), the protective film, and the second surface protective film is subjected to the chemical decoloring treatment. The chemical decoloring treatment involves bringing the laminate into contact with a basic solution. In the case where iodine is used as a dichromatic substance, when the basic solution is brought into contact with a desired portion of the resin film, the iodine content of the contact portion can be easily reduced.

The contact between the laminate and the basic solution may be performed by any appropriate means. Typical examples thereof include: the immersion of the laminate in the basic solution; and the application or spraying of the basic solution onto the laminate. Of those, immersion is preferred. This is because of the following reason: the decoloring treatment can be performed while the laminate is conveyed as illustrated in FIG. 5, and hence production efficiency is significantly high. As described above, the use of the first surface protective film (and, as required, the second surface protective film) enables the immersion. Specifically, when the laminate is immersed in the basic solution, only portions in the polarizer (polarizer intermediate) corresponding to the through-holes of the first surface protective film are brought into contact with the basic solution. For example, in the case where the polarizer (polarizer intermediate) contains iodine as a dichromatic substance, when the polarizer (polarizer intermediate) and the basic solution are brought into contact with each other, the iodine concentrations of the contact portions of the polarizer (polarizer intermediate) with the basic solution are reduced. As a result, the non-polarization portions can be selectively formed only in the contact portions (that can be set by the through-holes of the first surface protective film). As described above, according to this embodiment, the non-polarization portions can be selectively formed in the predetermined portions of the polarizer (polarizer intermediate) with extremely high production efficiency without any complicated operation. In the case where iodine remains in the resultant polarizer, even when the non-polarization portions are formed by breaking an iodine complex, there is a risk in that the iodine complex is formed again in association with the use of the polarizer, and hence the non-polarization portions do not have desired characteristics. In this embodiment, iodine itself is removed from the polarizer (substantially the non-polarization portions) by the removal of the basic solution to be described later. As a result, changes in characteristics of the non-polarization portions in association with the use of the polarizer can be prevented.

The formation of the non-polarization portions with the basic solution is described in more detail. After having been brought into contact with a predetermined portion of the polarizer (polarizer intermediate), the basic solution permeates into the predetermined portion. The iodine complex in the predetermined portion is reduced by a base in the basic solution to become an iodine ion. The reduction of the iodine complex to the iodine ion substantially eliminates the polarization performance of the portion and hence leads to the formation of a non-polarization portion in the portion. In addition, the reduction of the iodine complex increases the transmittance of the portion. Iodine that has become the iodine ion moves from the portion into the solvent of the basic solution. As a result, through the removal of the basic solution to be described later, the iodine ion is also removed from the portion together with the basic solution. Thus, a non-polarization portion (low concentration portion) is selectively formed in the predetermined portion of the polarizer (polarizer intermediate), and the non-polarization portion is a stable portion that does not change with time. The permeation of the basic solution into even an undesired portion (and as a result, the formation of a non-polarization portion in the undesired portion) can be prevented by adjusting, for example, the material, thickness, and mechanical characteristics of the first surface protective film, the concentration of the basic solution, and the time period for which the laminate is immersed in the basic solution.

Any appropriate basic compound may be used as a basic compound in the basic solution. Examples of the basic compound include: hydroxides of alkali metals, such as sodium hydroxide, potassium hydroxide, and lithium hydroxide; hydroxides of alkaline earth metals, such as calcium hydroxide; inorganic alkali metal salts, such as sodium carbonate; organic alkali metal salts, such as sodium acetate; and ammonia water. Of those, hydroxides of alkali metals and/or alkaline earth metals are preferably used, and sodium hydroxide, potassium hydroxide, and lithium hydroxide are more preferably used. The use of such basic compound can efficiently ionize the iodine complex, and hence can form the non-polarization portion with additional ease. Those basic compounds may be used alone or in combination.

Any appropriate solvent may be used as the solvent of the basic solution. Specific examples thereof include: water; alcohols, such as ethanol and methanol; ethers; benzene; chloroform; and mixed solvents thereof. The solvent is preferably water or an alcohol because an iodine ion satisfactorily migrates to the solvent and hence the iodine ion can be easily removed in the subsequent removal of the basic solution.

The concentration of the basic solution is, for example, from 0.01 N to 5 N, preferably from 0.05 N to 3 N, more preferably from 0.1 N to 2.5 N. When the concentration of the basic solution falls within such range, an iodine concentration in the polarizer (polarizer intermediate) can be efficiently reduced, and the ionization of the iodine complex in a portion except a predetermined portion can be prevented.

The liquid temperature of the basic solution is, for example, from 20° C. to 50° C. The time period for which the laminate (substantially the predetermined portions of the polarizer intermediate) and the basic solution are brought into contact with each other may be set in accordance with the thickness of the polarizer intermediate, the kind of the basic compound in the basic solution to be used, and the concentration of the basic compound, and is, for example, from 5 seconds to 30 minutes.

Boric acid may be incorporated into the polarizer (resin film). Boric acid may be incorporated by bringing a boric acid solution (e.g., an aqueous solution of boric acid) into contact with the polarizer at the time of, for example, the stretching treatment or the cross-linking treatment. The boric acid content of the polarizer (resin film) is, for example, from 10 wt % to 30 wt %. In addition, a boric acid content in a contact portion with the basic solution is, for example, from 5 wt % to 12 wt %.

After the contact with the basic solution, the amount of an alkali metal and/or an alkaline earth metal in the resin film is preferably reduced in the contact portion with which the basic solution has been brought into contact. The reduction of the amount of the alkali metal and/or the alkaline earth metal can provide a low concentration portion excellent in dimensional stability. Specifically, the shapes of the low concentration portions formed by the contact with the basic solution can be maintained as they are even under a humidified environment.

When the basic solution is brought into contact with the resin film, a hydroxide of the alkali metal and/or the alkaline earth metal may remain in the contact portion. In addition, when the basic solution is brought into contact with the resin film, a metal salt of the alkali metal and/or the alkaline earth metal may be produced in the contact portion. The hydroxide or the metal salt may produce a hydroxide ion, and the produced hydroxide ion may act on (decompose or reduce) a dichromatic substance (e.g., an iodine complex) present around the contact portion to expand a non-polarization region (low concentration region). Therefore, it is assumed that when the amount of the salt of the alkali metal and/or the alkaline earth metal is reduced, the expansion of the non-polarization region with time is suppressed and hence desired shapes of the non-polarization portions can be maintained.

The metal salt that may produce a hydroxide ion is, for example, a borate. The borate may be produced by the neutralization of boric acid in the resin film with a basic solution (a solution of a hydroxide of an alkali metal and/or a hydroxide of an alkaline earth metal). For example, when the polarizer is placed under a humidified environment, the borate (metaborate) may be hydrolyzed to produce a hydroxide ion as represented by the following formulae.

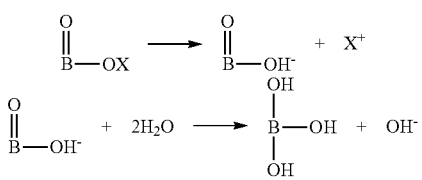

In the formulae, X represents an alkali metal or an alkaline earth metal.

The content of the alkali metal and/or the alkaline earth metal in the contact portion is preferably reduced so that the content may be 3.6 wt % or less, preferably 2.5 wt % or less, more preferably 1.0 wt % or less, still more preferably 0.5 wt % or less.

The alkali metal and/or the alkaline earth metal may be incorporated into the resin film in advance by subjecting the film to various treatments for turning the film into a polarizer. Potassium may be incorporated into the resin film by bringing a solution of an iodide, such as potassium iodide, into contact with the film. The alkali metal and/or the alkaline earth metal to be typically incorporated into the polarizer as described above may not adversely affect the dimensional stability of each of the low concentration portions.

A method involving bringing a treatment liquid into contact with the contact portion with the basic solution is preferably used as a method for the reduction. Such method can cause the alkali metal and/or the alkaline earth metal to migrate from the resin film to the treatment liquid to reduce the content.

Any appropriate method may be adopted as a method for the contact of the treatment liquid. Examples thereof include: a method involving dropping, applying, or spraying the treatment liquid onto the contact portion with the basic solution; and a method involving immersing the contact portion with the basic solution in the treatment liquid.

When the resin film is protected with any appropriate protective material at the time of the contact with the basic solution, the treatment liquid is preferably brought into contact with the film as it is (particularly in the case where the temperature of the treatment liquid is 50° C. or more). Such mode can prevent reductions in polarization characteristics due to the treatment liquid in a portion except the contact portion with the basic solution.

The treatment liquid may contain any appropriate solvent. Examples of the solvent include: water; alcohols, such as ethanol and methanol; ethers; benzene; chloroform; and mixed solvents thereof. Of those, water or an alcohol is preferably used from the viewpoint that the alkali metal and/or the alkaline earth metal are/is caused to efficiently migrate. Any appropriate water may be used as water. Examples thereof include tap water, pure water, and deionized water.

The temperature of the treatment liquid at the time of the contact is, for example, 20° C. or more, preferably 50° C. or more, more preferably 60° C. or more, still more preferably 70° C. or more. Such temperature can cause the alkali metal and/or the alkaline earth metal to efficiently migrate to the treatment liquid. Specifically, the temperature can significantly increase the swelling ratio of the resin film to physically remove the alkali metal and/or the alkaline earth metal in the resin film. Meanwhile, the temperature of water is substantially 95° C. or less.

The time period for which the contact portion and the treatment liquid are brought into contact with each other may be appropriately adjusted in accordance with, for example, the method for the contact, the temperature of the treatment liquid (water), and the thickness of the resin film. For example, when the contact portion is immersed in warm water, the contact time is preferably from 10 seconds to 30 minutes, more preferably from 30 seconds to 15 minutes, still more preferably from 60 seconds to 10 minutes.

In one embodiment, an acidic solution is used as the treatment liquid. The use of the acidic solution can neutralize the hydroxide of the alkali metal and/or the alkaline earth metal remaining in the resin film to chemically remove the alkali metal and/or the alkaline earth metal in the resin film.

Any appropriate acidic compound may be used as an acidic compound in the acidic solution. Examples of the acidic compound include: inorganic acids, such as hydrochloric acid, sulfuric acid, nitric acid, hydrogen fluoride, and boric acid; and organic acids, such as formic acid, oxalic acid, citric acid, acetic acid, and benzoic acid. Of those, an inorganic acid is preferred as the acidic compound in the acidic solution, and hydrochloric acid, sulfuric acid, or nitric acid is more preferred. Those acidic compounds may be used alone or in combination.

It is preferred that an acidic compound having an acidity stronger than that of boric acid be suitably used as the acidic compound. This is because the compound can act also on the metal salt (borate) of the alkali metal and/or the alkaline earth metal. Specifically, the alkali metal and/or the alkaline earth metal in the resin film can be chemically removed by liberating boric acid from the borate.

An indicator of the acidity is, for example, an acid dissociation constant (pKa), and an acidic compound having a pKa smaller than the pKa (9.2) of boric acid is preferably used. Specifically, the pKa is preferably less than 9.2, more preferably 5 or less. The pKa may be measured with any appropriate measuring apparatus, and reference may be made to a value disclosed in a literature, such as "Chemical Handbook Fundamentals revised 5th edition" (edited by The Chemical Society of Japan, Maruzen Publishing Co., Ltd.). In addition, in the case of an acidic compound that dissociates in a plurality of stages, its pKa value may change in each stage. When such acidic compound is used, such a compound that any one of the pKa values in the respective stages falls within the range is used. The pKa as used herein refers to a value in an aqueous solution at 25° C.

A difference between the pKa of the acidic compound and the pKa of boric acid is, for example, 2.0 or more, preferably from 2.5 to 15, more preferably from 2.5 to 13. When the difference falls within such range, the alkali metal and/or the alkaline earth metal can be caused to efficiently migrate to the treatment liquid, and as a result, a desired content of the alkali metal and/or the alkaline earth metal in each of the low concentration portions can be achieved.

Examples of the acidic compound that may satisfy the above-mentioned pKa include: inorganic acids, such as hydrochloric acid (pKa: −3.7), sulfuric acid ($pK_2$: 1.96), nitric acid (pKa: −1.8), hydrogen fluoride (pKa: 3.17), and boric acid (pKa: 9.2); and organic acids, such as formic acid (pKa: 3.54), oxalic acid ($pK_1$: 1.04, $pK_2$: 3.82), citric acid ($pK_1$: 3.09, $pK_2$: 4.75, $pK_3$: 6.41), acetic acid (pKa: 4.8), and benzoic acid (pKa: 4.0).

The solvent of the acidic solution (treatment liquid) is as described above, and also in this embodiment in which the acidic solution is used as the treatment liquid, the physical removal of the alkali metal and/or the alkaline earth metal in the resin film may occur.

The concentration of the acidic solution is, for example, from 0.01 N to 5 N, preferably from 0.05 N to 3 N, more preferably from 0.1 N to 2.5 N.

The liquid temperature of the acidic solution is, for example, from 20° C. to 50° C. The time period for which the resin film is brought into contact with the acidic solution may be set in accordance with the thickness of the resin film, the kind of the acidic compound, and the concentration of the acidic solution, and is, for example, from 5 seconds to 30 minutes.

The resin film may be further subjected to any appropriate other treatment in addition to the above-mentioned treatments. Examples of the other treatment include the removal of the basic solution and/or the acidic solution, and washing.

A method for the removal of the basic solution and/or the acidic solution is specifically, for example, removal by wiping with a waste cloth or the like, removal by suction, natural drying, heat drying, blow drying, or vacuum drying. The drying temperature is, for example, from 20° C. to 100° C. The drying time is, for example, from 5 seconds to 600 seconds.

The washing treatment is performed by any appropriate method. Examples of a solution to be used in the washing treatment include pure water, alcohols, such as methanol and ethanol, an acidic aqueous solution, and mixed solvents thereof. The washing is typically performed while the laminate is conveyed as illustrated in FIG. 5. The washing treatment may be performed at any appropriate stage. The washing treatment may be performed a plurality of times. In the illustrated example, after the contact with the basic solution, washing with water, the contact with the acidic solution, and washing with water are performed in the stated order.

After the non-polarization portions have been formed as described above (preferably after the reduction of the amount of the alkali metal and/or the alkaline earth metal), the first surface protective film and the second surface protective film may be typically peeled and removed.

The chemical decoloring treatment has been described above. However, as described above, the non-polarization portions may also be formed by, for example, laser irradiation or mechanical punching. An example of each of the laser irradiation and the mechanical punching is simply described below.

The laser irradiation may be performed by any appropriate mode. For example, the irradiation may be performed by using a laser irradiation apparatus in which a plurality of laser light sources are arranged according to a predetermined pattern, or the irradiation may be performed by moving a light source with an apparatus like an XY plotter. As described above, the laser irradiation is performed by moving a laser light source so that the light source may correspond to a predetermined position of the polarizer (polarizer intermediate), and hence the bonding of the first surface protective film is omitted and the bonding of the second surface protective film may also be omitted. The laser irradiation may be performed in appropriate conjunction with the conveyance of the laminate. For example, a desired position of the polarizer (polarizer intermediate) can be irradiated with laser light by appropriately adjusting the timing of the laser irradiation and/or the moving speed of a laser light source in consideration of the conveying speed of the laminate, and as a result, a non-polarization portion can be formed at the desired position of the polarizer (polarizer intermediate).

The laser light to be used in the laser irradiation preferably includes at least light having a wavelength of 1,500 nm or less. The laser light more preferably includes light having a wave length of from 100 µm to 1,000 nm, still more preferably includes light having a wavelength of from 400 nm to 900 nm, and particularly preferably includes light having a wavelength of from 420 nm to 680 nm. Examples of the laser include: solid lasers, such as a YAG laser, a YLF laser, a YVO4 laser, and a titanium sapphire laser; gas lasers including an argon ion laser and a krypton ion laser; fiber lasers; semiconductor lasers; and dye lasers. Of those, a solid laser is preferably used. Further, a short-pulse laser (a laser that applies light having a pulse width of 1 nanosecond or less, such as a picosecond laser or a femtosecond laser) is preferably used as the laser. A pulse width of 500 picoseconds or less (e.g., from 10 picoseconds to 50 picoseconds) is particularly preferred for the purpose of suppressing thermal damage to the polarizer (polarizer intermediate).

Conditions for the irradiation with the laser light may be set to any appropriate conditions. For example, when a solid laser (YVO4 laser) is used, its pulse energy is preferably from 10 µJ to 150 µJ, more preferably from 25 µJ to 71 µJ. Its repetition frequency is, for example, from 100 Hz to 12,480 Hz. A beam shape at a position to be irradiated with the laser light may be appropriately set in accordance with purposes and the desired shapes of the non-polarization portions. For example, the beam shape may be a circular shape or may be a line shape. Any appropriate means may be adopted as means for turning the beam shape into a predetermined shape. For example, the laser irradiation may be performed through a mask having a predetermined opening portion, or beam shaping may be performed with a diffractive optical element or the like. For example, when the beam shape is a circular shape, a focus diameter (spot diameter) is preferably from 50 µm to 60 µm. Such conditions enable satisfactory formation of the non-polarization portions without any damage to a peripheral member and the polarizer (polarizer intermediate) itself. Further, the input energy of a pulse laser is preferably from 20,000 µJ/mm$^2$ to 100,000 µJ/mm$^2$, more preferably from 25,000 µJ/mm$^2$ to 75,000 µJ/mm$^2$. When the input energy is excessively large, an adhesive or a pressure-sensitive adhesive to be used in the bonding of the polarizer is charred in some cases. When the input energy is excessively small, the hue of each of the non-polarization portions becomes yellow and hence the transparency thereof becomes insufficient in some cases.

The laser light preferably includes polarized light whose axis is substantially identical to the absorption axis of the polarizer (polarizer intermediate). Such laser light can further increase a difference in absorbance between the polarizer (polarizer intermediate) and a peripheral optical member thereof, and hence enables more satisfactory formation of the non-polarization portions.

The mechanical punching may be performed by any appropriate mode. For example, the mechanical punching may be performed by using a punching apparatus in which a plurality of punching blades are arranged according to a predetermined pattern, or may be performed by moving a punching blade with an apparatus like an XY plotter. As described above, the mechanical punching is performed by moving a punching blade so that the blade may correspond to a predetermined position of the polarizer (polarizer intermediate), and hence the bonding of the first surface protective film is omitted and the bonding of the second surface protective film may also be omitted. The mechanical punching may be performed in appropriate conjunction with the conveyance of the laminate. For example, a desired position of the polarizer (polarizer intermediate) can be punched by appropriately adjusting the timing of the punching and/or the moving speed of a punching blade in consideration of the conveying speed of the laminate, and as a result, a non-polarization portion (through-hole) can be formed at the desired position of the polarizer (polarizer intermediate).

Thus, the non-polarization portions are formed at the predetermined positions of the long polarizer (polarizer intermediate) according to a predetermined arrangement pattern, and hence the polarizer of the present invention can be obtained.

D. Image Display Apparatus

An image display apparatus of the present invention includes the polarizer cut into a predetermined size. Examples of the image display apparatus include a liquid crystal display apparatus and an organic EL device. Specifically, the liquid crystal display apparatus includes a liquid crystal panel including: a liquid crystal cell; and the polarizer arranged on one side, or each of both sides, of the liquid crystal cell. The organic EL device includes an organic EL panel including the polarizer arranged on a viewer side. The polarizer is arranged so that its non-polarization portion may correspond to the camera portion of the image display apparatus.

EXAMPLES

Now, the present invention is specifically described by way of Examples. However, the present invention is not limited to these Examples.

Example 1

An amorphous isophthalic acid-copolymerized polyethylene terephthalate (IPA-copolymerized PET) film of a long shape (thickness: 100 µm) having a water absorption ratio of 0.75% and a Tg of 75° C. was used as a resin substrate. One surface of the substrate was subjected to a corona treatment, and an aqueous solution containing polyvinyl alcohol (polymerization degree: 4,200, saponification degree: 99.2 mol %) and acetoacetyl-modified PVA (polymerization degree: 1,200, acetoacetyl modification degree: 4.6%, saponification degree: 99.0 mol % or more, manufactured by The Nippon Synthetic Chemical Industry Co., Ltd., trade name: "GOHSEFIMER Z-200") at a ratio of 9:1 was applied to the corona-treated surface and dried at 25° C. to form a PVA-based resin layer having a thickness of 11 µm. Thus, a laminate was produced.

The resultant laminate was subjected to free-end uniaxial stretching in an oven at 120° C. between rolls having different peripheral speeds in a longitudinal direction (lengthwise direction) at 2.0 times (in-air auxiliary stretching).

Next, the laminate was immersed in an insolubilizing bath having a liquid temperature of 30° C. (an aqueous solution of boric acid obtained by compounding 100 parts by weight of water with 4 parts by weight of boric acid) for 30 seconds (insolubilizing treatment).

Next, the laminate was immersed in a dyeing bath having a liquid temperature of 30° C. while an iodine concentration and an immersion time were adjusted so that a polarizing plate to be obtained had a predetermined transmittance. In this example, the laminate was immersed in an aqueous solution of iodine, which was obtained by compounding 100 parts by weight of water with 0.2 part by weight of iodine and 1.5 parts by weight of potassium iodide, for 60 seconds (dyeing treatment).

Next, the laminate was immersed in a cross-linking bath having a liquid temperature of 30° C. (an aqueous solution of boric acid obtained by compounding 100 parts by weight of water with 3 parts by weight of potassium iodide and 3 parts by weight of boric acid) for 30 seconds (cross-linking treatment).

After that, the laminate was subjected to uniaxial stretching between rolls having different peripheral speeds in a longitudinal direction (lengthwise direction) so that a total stretching ratio became 5.5 times while being immersed in an aqueous solution of boric acid having a liquid temperature of 70° C. (an aqueous solution obtained by compounding 100 parts by weight of water with 4 parts by weight of boric acid and 5 parts by weight of potassium iodide) (underwater stretching).

After that, the laminate was immersed in a washing bath having a liquid temperature of 30° C. (an aqueous solution obtained by compounding 100 parts by weight of water with 4 parts by weight of potassium iodide) (washing treatment).

Subsequently, a PVA-based resin aqueous solution (manufactured by The Nippon Synthetic Chemical Industry Co., Ltd., trade name: "GOHSEFIMER (trademark) Z-200", resin concentration: 3 wt %) was applied to the PVA-based resin layer surface of the laminate, and a protective film (thickness: 25 µm) was bonded thereto, followed by the heating of the resultant in an oven maintained at 60° C. for 5 minutes. After that, the substrate was peeled from the PVA-based resin layer. Thus, a long polarizing plate having a width of 1,200 mm and a length of 43 m (polarizer having a thickness of 5 µm (single axis transmittance: 42.3%)/protective film) was obtained.

A pressure-sensitive adhesive (acrylic pressure-sensitive adhesive) was applied to one surface of an ester-based resin film (thickness: 38 µm) having a width of 1,200 mm and a length of 43 m so as to have a thickness of 5 µm. Through-holes each having a diameter of 2.8 mm were formed in the ester-based resin film with the pressure-sensitive adhesive by using a pinnacle blade every 250 mm in its lengthwise direction and every 400 mm in its widthwise direction.

The ester-based resin film with the pressure-sensitive adhesive was bonded to the polarizer side of the resultant polarizing plate having a total thickness of 30 µm by a roll-to-roll process, and the resultant was immersed in a 1 mol/L (1 N) aqueous solution of sodium hydroxide for 30 seconds. Next, the resultant was immersed in 1 mol/L (1 N) hydrochloric acid for 10 seconds. After that, the resultant was dried at 60° C. Thus, transparent portions were formed in the polarizer.

Example 2

A PVA film having a thickness of 60 µm (manufactured by Kuraray Co., Ltd., PE6000) was immersed in an aqueous solution at 30° C. for 30 seconds (swelling step).

Next, the PVA film was immersed in a dyeing bath having a liquid temperature of 30° C. while an iodine concentration and an immersion time were adjusted so that a polarizing plate to be obtained had a predetermined transmittance. In this example, the PVA film was immersed in an aqueous solution of iodine obtained by compounding 100 parts by weight of water with 0.15 part by weight of iodine and 1.0 part by weight of potassium iodide for 60 seconds (dyeing treatment).

Next, the PVA film was immersed in a cross-linking bath having a liquid temperature of 30° C. (aqueous solution of boric acid obtained by compounding 100 parts by weight of water with 3 parts by weight of potassium iodide and 3 parts by weight of boric acid) for 30 seconds (cross-linking treatment).

After that, the PVA film was uniaxially stretched in its longitudinal direction (lengthwise direction) at 5.5 times between rolls having different peripheral speeds while being immersed in an aqueous solution of boric acid having a liquid temperature of 70° C. (aqueous solution obtained by compounding 100 parts by weight of water with 4 parts by weight of boric acid and 5 parts by weight of potassium iodide) (underwater stretching).

After that, the PVA film was immersed in a washing bath having a liquid temperature of 30° C. (aqueous solution obtained by compounding 100 parts by weight of water with 4 parts by weight of potassium iodide) (washing treatment).

After the washing, an aqueous solution of a PVA-based resin (manufactured by The Nippon Synthetic Chemical Industry Co., Ltd., trade name: "GOHSEFIMER (trademark) Z-200", resin concentration: 3 wt %) was applied to one surface of the PVA film, a triacetylcellulose film (manufactured by Konica Minolta, Inc., trade name: "KC4UY", thickness: 40 µm) was bonded thereto, and the resultant was heated in an oven maintained at 60° C. for 5 minutes. Thus, a polarizing plate including a polarizer having a thickness of 22 µm (single axis transmittance: 42.5%), the polarizing plate having a width of 1,200 mm and a length of 43 m, was produced.

The ester-based resin film with the pressure-sensitive adhesive having formed therein the through-holes was bonded to the polarizer surface of the resultant polarizing plate by a roll-to-roll process, and the resultant was immersed in a 1 mol/L (1 N) aqueous solution of sodium hydroxide for 180 seconds. Next, the resultant was immersed in 1 mol/L (1 N) hydrochloric acid for 60 seconds. After that, the resultant was dried at 60° C. Thus, transparent portions were formed in the polarizer.

The transparent portions of the polarizing plates of Examples were each evaluated for the following items.

1. Transmittance (Ts)

Measurement was performed with a spectrophotometer (manufactured by Murakami Color Research Laboratory, product name: "DOT-3"). A transmittance (T) is a Y value subjected to visibility correction with the two-degree field of view (C light source) of JIS Z 8701-1982.

2. Iodine Content

An iodine content in each of the transparent portions of a polarizer was determined by X-ray fluorescence analysis. Specifically, the iodine content of the polarizer was determined from a calibration curve produced in advance from an X-ray intensity measured under the following conditions through the use of a standard sample.

Analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Iodine measured line: I-LA
Quantification method: FP method
2θ angle peak: 103.078 deg (iodine)
Measurement time: 40 seconds The transparent portions (before the immersion in hydrochloric acid) of the polarizing plates obtained in Examples 1 and 2 had transmittances of 90.3% (Example 1) and 90.2% (Example 2), and iodine contents of 0.08 wt % (Example 1) and 0.12 wt % (Example 2), respectively. The iodine content of a portion except the transparent portions of each of the polarizers was about 5 wt %, and hence in each of Examples, transparent portions capable of functioning as non-polarization portions, the portions each having a dichromatic substance content lower than that of any other portion, were formed.

3. Sodium Content

A sodium content in each of the transparent portions of a polarizer was determined by X-ray fluorescence analysis. Specifically, the sodium content of the polarizer was determined from a calibration curve produced in advance from an X-ray intensity measured under the following conditions through the use of a standard sample. The measurement of the sodium content was performed before the immersion in hydrochloric acid and after the immersion.

Analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Sodium measured line: Na-KA
Quantification method: FP method
Measurement time: 40 seconds In the polarizing plate of Example 1, the sodium content of each of the transparent portions before the immersion in hydrochloric acid was 4.0 wt %, and the content after the immersion was 0.04 wt %. In addition, in the polarizing plate of Example 2, the sodium content of each of the transparent portions before the immersion in hydrochloric acid was 4.1 wt %, and the content after the immersion was 0.05 wt %.

In addition, the polarizing plates obtained in Examples were each placed under an environment at 65° C. and 90% RH for 500 hours. As a result, in each of Examples, no large changes in sizes of the transparent portions after a humidity test as compared to the sizes before the test were observed. The same humidity test was performed on each of polarizing plates produced in the same manner as in Examples 1 and 2 except that the immersion in hydrochloric acid was not performed. As a result, in each of the polarizing plates, the sizes of transparent portions each increased by a factor of about 1.3.

Further, surface smoothness near each of transparent portions was measured with an optical measuring instrument "ZYGO New View 7300" manufactured by Canon Inc. The results of the evaluations of the surface smoothness (size of unevenness) near the transparent portions of Examples 1 and 2 are shown in FIG. 6(a) and FIG. 6(b). In Example 1 in which the thickness of the polarizer was 5 µm, a step difference between each of the transparent portions (recessed portions) and any other portion was as small as 0.8 µm or less, and hence a smoother surface was obtained.

INDUSTRIAL APPLICABILITY

The polarizer of the present invention is suitably used in an image display apparatus (a liquid crystal display apparatus or an organic EL device) with a camera of, for example, a cellular phone, such as a smart phone, a notebook PC, or a tablet PC.

REFERENCE SIGNS LIST 10 non-polarization portion
20 resin film
100 polarizer
110 protective film 120 protective film
130 pressure-sensitive adhesive layer
132 separator
300 polarizing plate

The invention claimed is:

1. A polarizer, comprising a long resin film containing a dichromatic substance, the polarizer having non-polarization portions, the non-polarization portions comprising decolored portions formed through partial decoloring,
   wherein the non-polarization portions are arranged in a lengthwise direction and a widthwise direction at substantially equal intervals,
   wherein the non-polarization portions comprise low concentration portions each having a content of the dichromatic substance lower than that of any other portion,
   wherein a content of an alkali metal, an alkaline earth metal or the alkali metal and the alkaline earth metal in each of the low concentration portions is 3.6 wt % or less,
   the polarizer has a thickness of 10 μm or less,
   the content of the dichromatic substance in each of the low concentration portions is 0.2 wt % or less, and
   a step difference between each of the non-polarizing portion and any other portion is 1 μm or less.

2. The polarizer according to claim 1, wherein when the polarizer is cut into a predetermined size to be mounted on an image display apparatus having a predetermined size, the non-polarization portions are each arranged at a position corresponding to a camera portion of the image display apparatus.

3. The polarizer according to claim 1, wherein a direction of a straight line connecting the non-polarization portions adjacent to each other falls within a range of ±10° with respect to at least the lengthwise direction or the widthwise direction.

4. The polarizer according to claim 1, wherein the non-polarization portions each have a transmittance of 90% or more.

5. The polarizer according to claim 1, wherein the non-polarization portions are arranged in a dotted manner.

6. The polarizer according to claim 1, wherein a plan-view shape of each of the non-polarization portions comprises a substantially circular shape or a substantially rectangular shape.

7. The polarizer according to claim 1, wherein the non-polarization portions each include a recessed portion having a recessed surface on one surface side of the resin film.

8. The polarizer according to claim 1, wherein the low concentration portions are formed by bringing a basic solution into contact with the resin film.

9. The polarizer according to claim 8, wherein the basic solution comprises an aqueous solution containing a hydroxide of at least an alkali metal or an alkaline earth metal.

10. The polarizer according to claim 1, wherein the polarizer has an absorption axis in a direction substantially parallel to the lengthwise direction or the widthwise direction, and both end portions of the polarizer are subjected to slitting parallel to the lengthwise direction.

11. The polarizer according to claim 1, wherein the polarizer is wound in a roll shape.

12. The polarizer according to claim 1, wherein the polarizer is cut into a predetermined size to be used for producing a plurality of polarizer pieces each having a non-polarization portion.

13. A long polarizing plate, comprising:
   the polarizer of claim 1; and
   a protective film arranged on at least one side of the polarizer.

14. The polarizing plate according to claim 13, wherein the protective film has a thickness of 80 μm or less.

15. The polarizing plate according to claim 13, further comprising a pressure-sensitive adhesive layer as one outermost layer.

16. The polarizing plate according to claim 13, wherein the polarizing plate is cut into a predetermined size to be used for producing a plurality of polarizing plate pieces each including a polarizer having a non-polarization portion and a protective film arranged on at least one side of the polarizer.

17. An image display apparatus, comprising the polarizer of claim 1 cut into a predetermined size, wherein the non-polarization portions of the polarizer are each arranged at a position corresponding to a camera portion.

* * * * *